(12) United States Patent
Liu

(10) Patent No.: US 10,697,805 B2
(45) Date of Patent: *Jun. 30, 2020

(54) ENCODER DEVICE, METHOD FOR MEASURING MOVING AMOUNT, OPTICAL APPARATUS, EXPOSURE APPARATUS, EXPOSURE METHOD AND METHOD FOR PRODUCING DEVICE

(71) Applicant: NIKON CORPORATION, Tokyo (JP)

(72) Inventor: Zhigiang Liu, Kawasaki (JP)

(73) Assignee: NIKON CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/919,519

(22) Filed: Mar. 13, 2018

(65) Prior Publication Data

US 2018/0202842 A1 Jul. 19, 2018

Related U.S. Application Data

(63) Continuation of application No. 13/678,857, filed on Nov. 16, 2012, now Pat. No. 9,939,293.

(Continued)

(30) Foreign Application Priority Data

Nov. 17, 2011 (JP) ................. 2011-251986

(51) Int. Cl.
*G03F 7/20* (2006.01)
*G01D 5/34* (2006.01)
(Continued)

(52) U.S. Cl.
CPC ........... *G01D 5/34* (2013.01); *G01D 5/34715* (2013.01); *G01D 5/38* (2013.01); *G03B 27/58* (2013.01); *G03F 7/70775* (2013.01)

(58) Field of Classification Search
CPC ........ G01D 5/34; G01D 5/34715; G01D 5/38; G03B 27/58; G03F 7/70775
See application file for complete search history.

(56) References Cited

U.S. PATENT DOCUMENTS 5,120,132 A 6/1992 Spies
5,610,715 A 3/1997 Yoshii
(Continued)

FOREIGN PATENT DOCUMENTS

WO WO 2008/029757 A1 3/2008

OTHER PUBLICATIONS

Notice of Allowance dated Dec. 12, 2017 in U.S. Appl. No. 13/378,857.
(Continued)

*Primary Examiner* — Deoram Persaud

(57) ABSTRACT

An encoder, which measures a relative moving amount of a second member relative to a first member, includes: a diffraction grating provided on the first member; a light-incident optical member causing a measuring light to come into a grating pattern surface of the diffraction grating substantially perpendicularly; a first reflecting member provided on the second member and reflecting a diffracted light generated from the diffraction grating; a first direction-changing member changing a direction of the diffracted light; a first photo-detector detecting an interference light generated by interference between a double diffracted light and other diffracted light than the double diffracted light or a reference light, the double diffracted light being generated, via diffraction of the diffracted light, from the diffraction grating; and a measuring section which obtains the relative moving amount of the second member relative to the first member by using a detection signal from the first photo-detector.

20 Claims, 9 Drawing Sheets

Related U.S. Application Data

(60) Provisional application No. 61/581,931, filed on Dec. 30, 2011.

(51) Int. Cl.
*G01D 5/347* (2006.01)
*G01D 5/38* (2006.01)
*G03B 27/58* (2006.01)

(56) References Cited

U.S. PATENT DOCUMENTS

| | | |
|---|---|---|
| 6,262,796 B1 | 7/2001 | Loopstra et al. |
| 6,341,007 B1 | 1/2002 | Nishi et al. |
| 6,839,141 B2 | 1/2005 | Hill |
| 7,196,797 B2 | 3/2007 | Bockman |
| 7,394,550 B2 | 7/2008 | Takahashi |
| 8,115,906 B2 | 2/2012 | Shibazaki |
| 8,228,482 B2 | 7/2012 | Kanaya |
| 8,237,916 B2 | 8/2012 | Shibazaki |
| 2003/0025890 A1 | 2/2003 | Nishinaga |
| 2003/0098411 A1 | 5/2003 | Lee |
| 2006/0023178 A1* | 2/2006 | Loopstra ............ G03F 7/70458 355/53 |
| 2006/0039006 A1 | 2/2006 | Van Der Pasch |
| 2007/0058172 A1 | 3/2007 | Van Der Pasch |
| 2007/0127006 A1 | 6/2007 | Shibazaki |
| 2007/0223007 A1 | 9/2007 | Klaver |
| 2008/0094593 A1 | 4/2008 | Shibazaki |
| 2008/0285051 A1 | 11/2008 | Hill |
| 2008/0304079 A1 | 12/2008 | Schluchter |
| 2009/0268210 A1 | 10/2009 | Prince |
| 2009/0284717 A1 | 11/2009 | Kanaya |
| 2009/0284723 A1 | 11/2009 | Shibazaki |
| 2009/0284724 A1 | 11/2009 | Kanaya |
| 2010/0073652 A1 | 3/2010 | Shibazaki |
| 2010/0082095 A1 | 4/2010 | Pacetti et al. |
| 2010/0297561 A1 | 11/2010 | Beerens |
| 2011/0255096 A1 | 10/2011 | Deck |
| 2012/0127453 A1 | 5/2012 | Shibazaki |
| 2012/0154780 A1 | 6/2012 | Demarest |
| 2012/0194824 A1 | 8/2012 | de Groot |
| 2013/0114061 A1 | 5/2013 | de Groot et al. |
| 2015/0160044 A1 | 6/2015 | Liu |

OTHER PUBLICATIONS

Notice of Allowance dated Aug. 11, 2017 in U.S. Appl. No. 13/378,857.
Notice of Allowance dated Apr. 20, 2017 in U.S. Appl. No. 13/378,857.
Office Action dated Dec. 13, 2016 in U.S. Appl. No. 13/378,857.
Advisory Action dated Sep. 29, 2016 in U.S. Appl. No. 13/378,857.
Office Action dated Jun. 22, 2016 in U.S. Appl. No. 13/378,857.
Office Action dated Feb. 2, 2016 in U.S. Appl. No. 13/378,857.
Office Action dated Jun. 29, 2015 in U.S. Appl. No. 13/378,857.
U.S. Appl. No. 13/678,857, filed Nov. 16, 2012, Zhigiang Liu, Nikon Corporation.

* cited by examiner

ENCODER DEVICE, METHOD FOR MEASURING MOVING AMOUNT, OPTICAL APPARATUS, EXPOSURE APPARATUS, EXPOSURE METHOD AND METHOD FOR PRODUCING DEVICE

CROSS REFERENCE TO RELATED APPLICATION

The present application in a continuation of U.S. patent application Ser. No. 13/678,857, filed Nov. 16, 2012, which claims priorities from Japanese patent application No. 2011-251986 filed on Nov. 17, 2011, and U.S. Provisional patent application No. 61/581,931 filed on Dec. 30, 2011, all the disclosures of which are incorporated herein by reference in their entireties.

TECHNICAL FIELD

The present teaching relates to an encoder device which measures relative moving amount between members which move relative to each other and a moving-amount measuring method for measuring the relative moving amount; an optical apparatus and an exposure apparatus which are provided with the encoder device; a method for producing a device using the exposure apparatus; and an exposure method using the method for measuring the relative moving amount.

BACKGROUND ART

In an exposure apparatus such as a so-called stepper or scanning stepper, which is used in the photolithography process for producing electronic devices (micro devices) such as semiconductor devices, etc., a laser interferometer is conventionally used to measure the position of a stage moving a substrate as the exposure objective. In the laser interferometer, however, the optical path for a measuring beam is long and tends to vary (change), and thus there is a short-term change (variation) of the measured value caused due to the temperature fluctuation (change, variation) in the atmosphere on the optical path, which is becoming all the more unignorable.

In order to address the above-described situation, for example, there is utilized in recent years a so-called encoder device (interfering type encoder) which irradiates a measuring light (measuring light beam) composed of a laser light (laser light beam) onto a diffraction grating fixed on a member (stage, etc.), and which measures a relative moving amount of the stage having the diffraction grating provided thereon, from a detection signal obtained by photo-electrically converting an interference light (interference light beam) generated by interference between a diffracted light (diffracted light beam) generated from the diffraction grating and other diffracted light or a reference light (reference light beam) (see, for example, International Publication No. WO2008/029757). This encoder device has more excellent short-term stability in the measured value than the laser interferometer, and has become to be capable of achieving a resolving power which is close to that of the laser interferometer.

SUMMARY

In a conventional encoder device, a diffracted light generated from the diffraction grating is reflected by a planar mirror, etc. Accordingly, there is a fear that when the height of a grating pattern surface of the diffraction grating is changed or varied, the diffracted light from the grating pattern surface might be shifted relative to the other diffracted light or the reference light, thereby lowering the signal intensity of the interference light.

An aspect of the present teaching is to address such a problem described above, and an object of the aspect is to suppress the lowering of signal intensity of the interference light caused, when the relative moving amount is measured by using the diffraction grating, due to a change in the height of the grating pattern surface.

Solution to the Problem

According to a first aspect of the present teaching, there is provided an encoder device which measures a relative moving amount of a second member relative to a first member, the second member being movable relative to the first member at least in a first direction, the encoder device comprising: a reflective-type diffraction grating provided on one of the first and second members and having a grating pattern of which periodic direction is at least the first direction; a light source section which generates a measuring light; a light-incident optical member which causes the measuring light to come into a grating pattern surface of the diffraction grating substantially perpendicularly; a first reflecting member which is provided on the other of the first and second members, which has three reflecting surfaces and which reflects, via the three reflecting surfaces, a first diffracted light generated, via diffraction of the measuring light, from the diffraction grating in relation to the first direction; a first direction-changing member arranged between the diffraction grating and the first reflecting member and changing a direction of the first diffracted light so as to make an incident angle, at which the first diffracted light comes into the diffraction grating, be smaller than a diffraction angle of the first diffracted light; a first photo-detector which detects an interference light generated by interference between a double diffracted light and other diffracted light than the double diffracted light or a reference light, the double diffracted light being generated, via diffraction of the first diffracted light, from the diffraction grating; and a measuring section which obtains the relative moving amount of the second member relative to the first member by using a detection signal from the first photo-detector.

Further, according to a second aspect of the present teaching, there is provided a moving-amount measuring method for measuring a relative moving amount of a second member relative to a first member, the second member being movable relative to the first member at least in a first direction, the measuring method comprising: causing a measuring light to come, substantially perpendicularly, into a grating pattern surface of a reflective-type diffraction grating which is provided on one of the first and second members, the grating pattern surface having a grating pattern of which periodic direction is at least the first direction; reflecting, via three reflecting surfaces, a first diffracted light generated, via diffraction of the measuring light, from the diffraction grating in relation to the first direction; changing a direction of the first diffracted light so as to make an incident angle, at which the first diffracted light comes into the diffraction grating, be smaller than an diffraction angle of the first diffracted light generated by the measuring light; detecting an interference light generated by interference between a double diffracted light and other diffracted light than the double diffracted light or a reference light, the double diffracted light being generated, via diffraction of the first diffracted light, from the diffraction grating; and obtaining the relative moving amount of the second member relative to the first member based on the detecting of the interference light.

Furthermore, according to a third aspect of the present teaching, there is provided an optical apparatus comprising: the encoder device of the first aspect; a moving device which moves an object based on a measurement result of the encoder device; and an optical system for the object.

Moreover, according to a fourth aspect of the present teaching, there is provided an exposure apparatus which exposes an object to be exposed with a pattern, the exposure apparatus comprising: a frame; a stage which supports the object and which is movable relative to the frame at least in a first direction; and the encoder device of the first aspect which measures a relative moving amount of the stage relative to the frame in the first direction.

According to a fifth aspect of the present teaching, there is provided an exposure method for exposing an object to be exposed with a pattern, the exposure method comprising: supporting the object by a stage; measuring a relative moving amount of the stage relative to a frame by using the moving-amount measuring method of the second aspect; and exposing the object.

According to a sixth aspect of the present teaching, there is provided a method for producing a device, the method comprising a lithography step, wherein an object is exposed in the lithography step by using the exposure apparatus of the fourth aspect.

DESCRIPTION OF THE EMBODIMENTS

First Embodiment

A first embodiment of the present teaching will be explained with reference to FIGS. 1, 2A, 2B, 3A and 3B.

Figure 1:
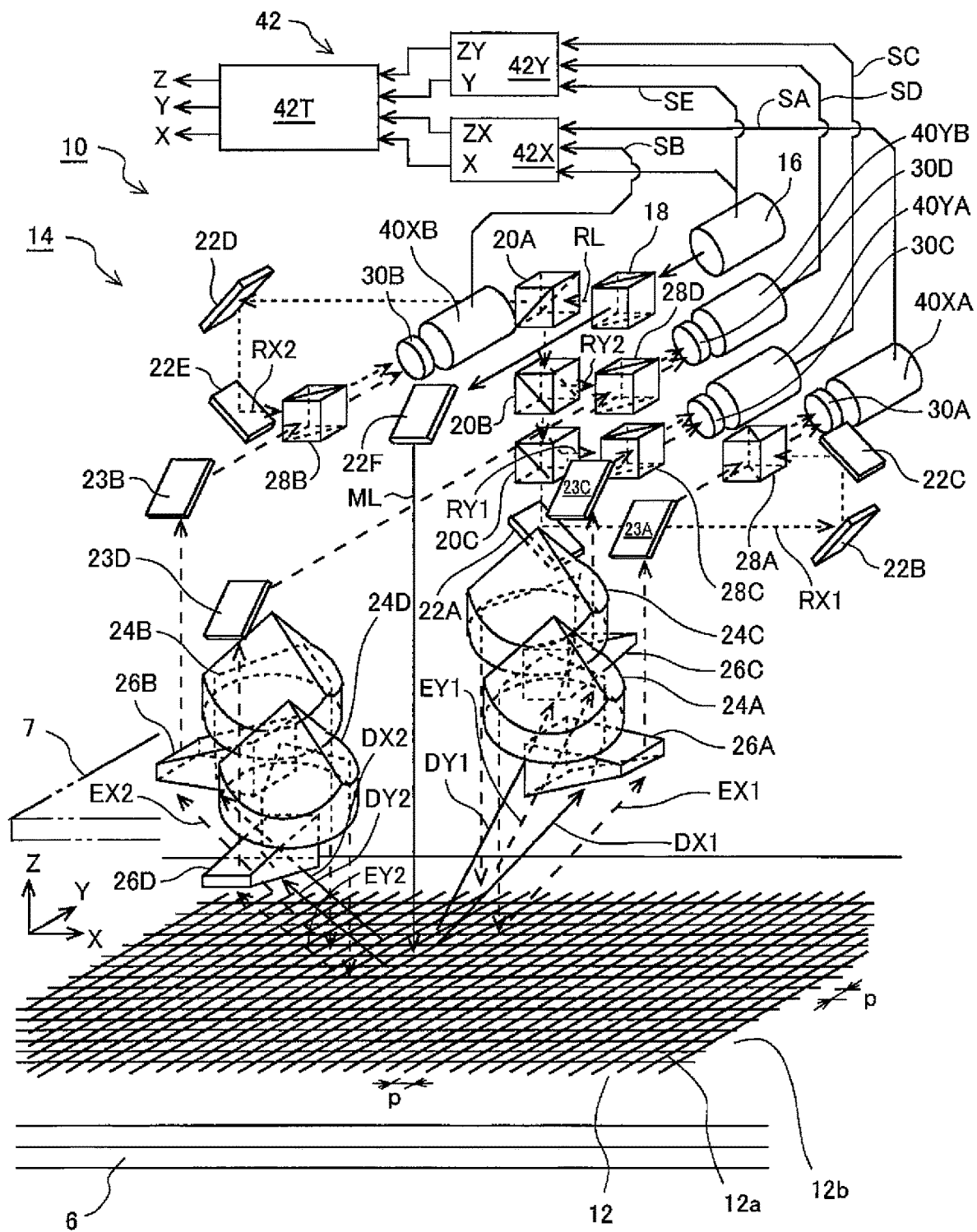
FIG. 1 is a perspective view of an encoder according to a first embodiment of the present teaching.

FIG. 1 is a perspective view showing main components or parts of a three-axis encoder 10 according to the embodiment. In FIG. 1, as an example, a second member 7 is arranged to be movable three-dimensionally relative to a first member 6. The following explanation will be made assuming that the X axis and the Y axis extend parallel to two relative-movement directions, respectively, which are orthogonal to each other and in which the second member 7 is movable relative to the first member 6, and the Z axis extends in a relative movement direction which is orthogonal to a plane (XY plane) defined by the X axis and the Y axis and in which the second member is movable relative to the first member 6. Further, angles of rotation (inclinations) about the axes parallel to the X axis, the Y axis, and the Z axis are designated as angles in θx, θy, and θz directions respectively.

In FIG. 1, the encoder 10 has a two-dimensional diffraction grating 12 which has a flat plate-shape (planar shape) substantially parallel to the XY plane, and which is fixed to the upper surface of the first member 6; and a three-axis detection head 14 which has X, Y and Z axes, which is fixed to the second member 7 and which irradiates a measuring light ML to the diffraction grating 12; a laser light source 16 which supplies a laser light (laser light beam) for measurement to the detection head 14; and a measurement calculation section 42 which processes a detection signal outputted from the detection head 14 and which obtains a relative movement amount of the second member 7 relative to the first member 6 (the relative moving amount between the first and second members 6, 7) in the X, Y, and Z directions.

The diffraction grating 12 has a grating pattern surface 12b which is substantially parallel to the XY plane; a two-dimensional grating pattern 12a, which has a predetermined period (pitch) P in each of the X and Y directions and which is a phase-type and reflective-type grating, is formed on the grating pattern surface 12b. The periods P in the X and Y directions of the grating pattern 12a are, as an example, each about 100 nm to about 4 μm (for example, 1 μm period). Note that the period in the X direction and the period in the Y direction of the grating pattern 12a may be different from each other. The grating pattern 12a may be produced, for example, as a hologram (for example, those obtained by printing interference fringes onto a photosensitive resin). Alternatively, the grating pattern 12a may be produced by forming grooves, etc. mechanically in a glass plate, etc., and by coating a reflective film on the grooves, etc. Further alternatively, the grating pattern surface 12b may be covered by a protective flat glass plate.

The laser light source 16 is composed, for example, of a He—Ne laser or a semiconductor laser, etc., and radiates, as an example, a two-frequency heterodyne light composed of first and second linearly polarized laser lights of which frequencies are different from each other and of which polarization directions are orthogonal to each other. These laser lights are coherent with each other (in a case that the polarization directions are made to be parallel to each other); and the average wavelength of these laser lights is referred to as "λ". The laser light source 16 supplies, to the measurement calculation section 42, a signal of reference frequency (reference signal SE) which is obtained by photoelectrically converting an interference light formed or generated by interference between two light fluxes branched from these laser lights respectively. Note that it is also allowable to use the homodyne interference system.

The detection head 14 has a polarization beam splitter (hereinafter referred to as "PBS") 18 which splits the heterodyne light supplied from the laser light source 16 into a P-polarized measuring light ML and a S-polarized reference light RL of which frequencies are different from each other; a beam splitter 20A which branches a X-axis second reference light RX2 from the reference light RL; beam splitters 20B and 20C which subsequently branch Y-axis second reference light RY2 and Y-axis first reference light RY1, respectively, from a reference light reflected by the beam splitter 20A; mirrors 22A, 22B and 22C which direct (guide) a X-axis first reference light RX1 transmitted through the beam splitter 20C in a −X direction; and mirrors 22D and 22E which direct (guide) the X-axis second reference light RX2 in a +X direction. Each of the measuring light ML and the reference light RL has a circular-shaped cross section which has a diameter of, for example, about 0.5 mm to several mm. Further, the detection head 14 has a PBS (polarized beam splitter) 28A which coaxially combines the X-axis first reference light RX1 with an X-axis +1st order diffracted light EX1 (to be described later on) and a PBS (polarized beam splitter) 28B which coaxially combines the X-axis second reference light RX2 with an X-axis −1st order (a different order from the +1st order) diffracted light EX2 (to be described later on); polarizing plates 30A and 30B through each of which the interference light coaxially combined in one of the PBS 28A and the PBS 28B transmits; and X-axis photoelectric sensors 40XA and 40XB such as photodiodes, etc., which detect the interference lights transmitted through the polarizing plates 30A and 30B, respectively. Furthermore, the detection head 14 has a PBS (polarized beam splitter) 28C which coaxially combines the Y-axis first reference light RY1 with an Y-axis +1st order diffracted light EY1 (to be described later on) and a PBS (polarized beam splitter) 28D which coaxially combines the Y-axis second reference light RY2 with an Y-axis −1st order diffracted light EY2 (to be described later on); polarizing plates 30C and 30D through each of which the interference light coaxially combined in one of the PBS 28C and the PBS 28D transmits; and Y-axis photoelectric sensors 40YA and 40YB (having same constructions as that of the photoelectric sensor 40XA) which detect the interference lights transmitted through the polarizing plates 30C and 30D, respectively.

Moreover, the detection head 14 has a mirror 22F which reflects the P-polarized measuring light ML transmitted through the PBS 18 and causes the P-polarized measuring light ML to come into the grating pattern surface 12b (grating pattern 12a) of the diffraction grating 12 substantially perpendicularly (substantially parallel to the Z axis). The term "cause (the P-polarized measuring light ML) to come into (the grating pattern surface 12b . . . ) substantially perpendicularly" herein means including not only a case that the measuring light ML is caused to come into the grating pattern surface 12b perpendicularly, but also a case that the measuring light ML is caused to come into the grating pattern surface 12b while being inclined, for example, at about 0.5 degree to about 1.5 degrees, with respect to an axis parallel to the Z axis, in the X direction (θy direction) and/or in the Y direction (θx direction) for the purpose of lowering the effect or influence brought about by the 0-order light (regular reflection, specular reflection). The PBSes 18, 28A to 28D, the beam splitters 20A to 20C, the mirrors 22A to 22F and the photoelectric sensors 40XA, 40XB, 40YA and 40YB are supported by a support member (not shown in the drawing) which is fixed to the second member 7.

In this embodiment, from the measuring light ML coming into the grating pattern surface 12b of the diffraction grating 12 substantially perpendicularly, there are generated ±1st order diffracted lights DX1 and DX2 which are symmetric in the X direction and ±1st order diffracted lights DY1 and DY2 which are symmetric in the Y direction. The detection head 14 has a X-axis, wedge-shaped (cuneiform) first prism 26A which directs (guides) the optical path of the +1st order diffracted light DX1 substantially parallel to the +Z direction; an X-axis first corner cube 24A which reflects the diffracted light DX1, transmitted through the cuneiform prism 26A, so that the reflected diffracted light DX1 comes into the grating pattern surface 12b of the diffraction grating 12 substantially perpendicularly; a X-axis, wedge-shaped (cuneiform) second prism 26B which directs (guides) the optical path of the −1st order diffracted light DX2 substantially parallel to the +Z direction; an X-axis second corner cube 24B which reflects the diffracted light DX2, transmitted through the cuneiform prism 26B, so that the reflected diffracted light DX2 comes into the grating pattern surface 12b of the diffraction grating 12 substantially perpendicularly; and mirrors 23A and 23B (to be described later on). The cuneiform prisms 26A and 26B are prisms which are arranged symmetrically with respect to the measuring light ML coming into the diffraction grating 12, which have a mutually same shape and each of which has a light-incident surface and a light-exit surface (two surfaces). The corner cubes 24A and 24B have a mutually same shape and are arranged symmetrically with respect to the measuring light ML; and each of the corner cubes 24A and 24B is an optical element having three reflecting surfaces which are orthogonal to one another and a light-incident surface; the corner cubes 24A and 24B are arranged parallel to each other so that the light-incident surfaces thereof are parallel to the XY plane (so that the light-incident surfaces of the corner cubes 24A and 24B are substantially perpendicular to the optical paths of the ±1st order diffracted lights DX1 and DX2 coming thereinto, respectively).

Figure 2A:
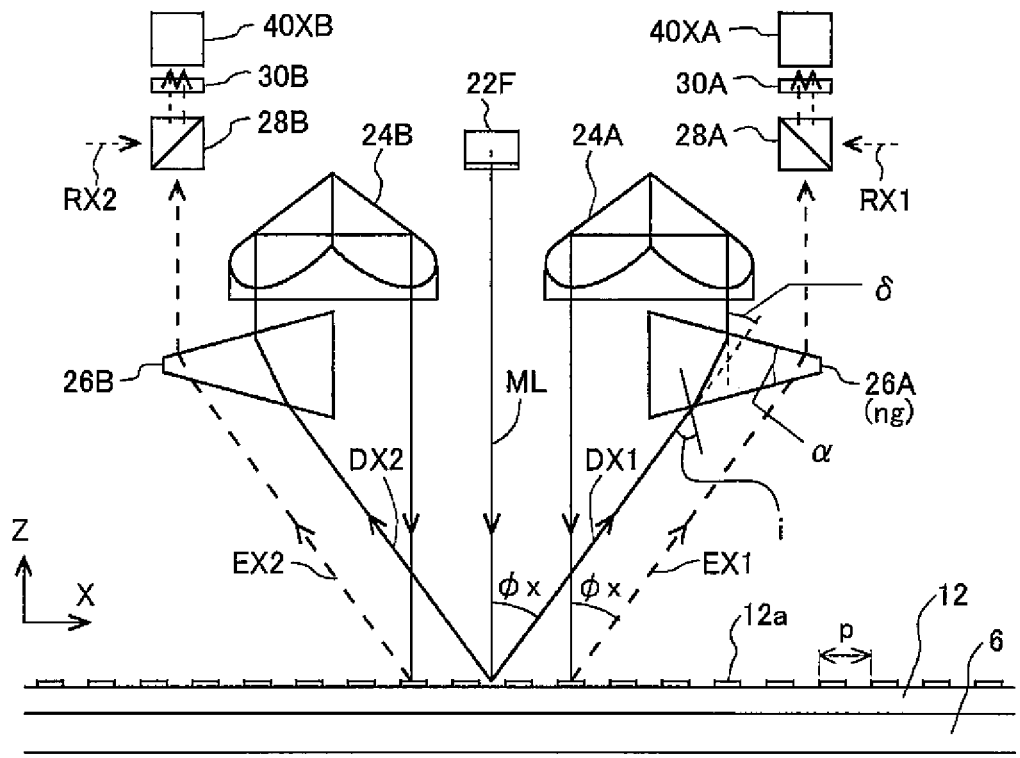
FIG. 2A is a diagram showing optical path of ±1 order diffracted lights in X direction and FIG. 2B is a diagram showing optical path of ±1st order diffracted lights in Y direction in the encoder shown in FIG. 1.

In this case, as shown in FIG. 2A, a +1st order diffracted light EX1 (double-diffracted light) and a −1st order diffracted light EX2 (double-diffracted light) are generated, via diffraction of the diffracted lights DX1 and DX2 reflected by the corner cubes 24A and 24B respectively, from the diffraction grating 12 symmetrically in the X direction, with respect to the measuring light ML. The optical paths of the generated diffracted lights EX1 and EX2 are changed by the cuneiform prisms 26A and 26B, respectively, in the +Z direction; and then the diffracted lights EX1 and EX2 arrive at the PBS 28A and 28B via the mirrors 23A and 23B (shown in FIG. 1), and are coaxially combined with the reference lights RX1 and RX2 by the PBS 28A and 28B, respectively, as combined interference lights. The combined interference lights are received by the photoelectric sensors 40XA and 40XB, respectively.

In FIG. 1, the detection head 14 has a wedge-shaped (cuneiform) first prism 26C which directs (guides) the optical path of the +1st order diffracted light DY1 substantially parallel to the +Z direction, and a wedge-shaped (cuneiform) second prism 26D which directs (guides) the optical path of the −1st order diffracted light DY2 substantially parallel to the +Z direction; a Y-axis first corner cube 24C which reflects the diffracted light DY1 transmitted through the cuneiform prism 26C toward the grating pattern surface 12b of the diffraction grating 12, and a Y-axis second corner cube 24D which reflects the diffracted light DY2 transmitted through the cuneiform prism 26D toward the grating pattern surface 12b of the diffraction grating 12; and mirrors 23C and 23D (to be described later on). The Y-axis cuneiform prisms 26C and 26D have shape and arrangement obtained by rotating the X-axis cuneiform prisms 26A and 26B by 90 degrees about the measuring light ML coming into the diffraction grating 12; and the Y-axis corner cubes 24C and 24D have shape and arrangement obtained by rotating the X-axis corner cubes 24A and 24B by 90 degrees about the measuring light ML coming into the diffraction grating 12.

In this case, as shown in FIG. 28, a +1st order diffracted light EY1 (double-diffracted light) and a −1st order diffracted light EY2 (double-diffracted light) are generated, via diffraction of the diffracted lights DY1 and DY2 reflected by the corner cubes 24C and 24D respectively, from the diffraction grating 12 symmetrically in the Y direction, with respect to the measuring light ML. The optical paths of the generated diffracted lights EY1 and EY2 are changed by the cuneiform prisms 26C and 26D, respectively, in the +Z direction; and then the diffracted lights EY1 and EY2 arrive at the PBS 28C and 28D via the mirrors 23C and 23D (shown in FIG. 1), and are coaxially combined with the reference lights RY1 and RY1 by the PBS 28C and 28D, respectively, as combined interference lights. The combined interference lights are received by the photoelectric sensors 40YA and 40YB, respectively. In this embodiment, the cuneiform prisms 26A, 268, 26C and 26D are used also as the optical elements for changing the optical paths of the diffracted lights EX1, EX2, EY1 and EY2, respectively. Therefore, the construction of the detection head 14 can be made simple. Note that it is allowable to use a member different from the cuneiform prisms 26A to 26D (for example, other small-sized prisms or mirrors) in order to change the optical paths of the diffracted lights EX1, EX2, EY1 and EY2.

The corner cubes 24A to 24D, the cuneiform prisms 26A to 26D and the mirrors 23A to 23D are also supported by the support member (not shown in the drawing) fixed to the second member 7. In this embodiment, the corner cubes 24A to 24D are arranged so that the light-incident surfaces thereof are parallel to the XY plane (so that the light-incident surfaces of the corner cubes 24A to 24D are parallel to the grating pattern surface 12b), and the corner cubes 24A and 24D are arranged about the measuring light ML coming into the diffraction grating 12 by 90-degree intervals. Accordingly, it is possible to easily support the corner cubes 24A to 24D having the complex shapes in an accurate positional relationship. Note that it is allowable to use a reflecting member (retro reflectors), etc. formed by combining three reflecting members having reflecting surfaces respectively wherein the reflecting surfaces of the three reflecting members are orthogonal to each other, instead of using the corner cubes 24A to 24D.

In FIG. 1, the measurement calculation section 42 has a first calculation section 42X, a second calculation section 42Y and a third calculation section 42T. The X-axis photoelectric sensor 40XA supplies a detection signal (photoelectric conversion signal) SA of an interference light generated by interference between the X-axis diffraction light EX1 and the reference light RX1 to the first calculation section 42X, and the X-axis photoelectric sensor 40XB supplies a detection signal SB of an interference light generated by interference between the X-axis diffraction light EX2 and the reference light RX2 to the first calculation section 42X. Further, the Y-axis photoelectric sensor 40YA supplies a detection signal SC of an interference light generated by interference between the Y-axis diffraction light EY1 and the reference light RY1 to the second calculation section 42Y, and the Y-axis photoelectric sensor 40YB supplies a detection signal SD of an interference light generated by interference between the Y-axis diffraction light EY2 and the reference light RY2 to the second calculation section 42Y. A signal of the reference frequency (reference signal SE) is also supplied from the laser light 16 to the first calculation section 42X and the second calculation section 42Y.

Here, relative moving amounts of the second member 7 relative to the first member 6 in the X, Y and Z directions are referred to as "X", "Y" and "Z", respectively; and relative moving amounts in the Z direction obtained in the first calculation section 42X and the second calculation section 42Y are referred to as "ZX" and "ZY", respectively. In this case, as an example, the first calculation section 42X obtains a first relative moving amount (a·X+b·ZX) in the X and Z directions from the detection signal SA and the reference signal SE by using previously known coefficients "a" and "b"; the first calculation section 42X obtains a second relative moving amount (−a·X+b·ZX) in the X and Z directions from the detection signal SB and the reference signal SE; the first calculation section 42X obtains a X-direction relative moving amount (X) and a Z-direction relative moving amount (ZX) in the X and Z directions from the first and second relative moving amounts; and then the first calculation section 42X supplies the calculation results to the third calculation section 42T. The second calculation section 42Y obtains a first relative moving amount (a·Y+b·ZY) in the Y and Z directions from the detection signal SC and the reference signal SE; the second calculation section 42Y obtains a second relative moving amount (−a·Y+b·ZX) in the Y and Z directions from the detection signal SD and the reference signal SE; the second calculation section 42Y obtains a Y-direction relative moving amount (Y) and a Z-direction relative moving amount (ZY) in the Y and Z directions from the first and second relative moving amounts; and then the second calculation section 42Y supplies the calculation results to the third calculation section 42T.

The third calculation section 42T outputs, as the relative moving amounts of the second member 7 relative to the first member 6 in the X and Y directions, values obtained by correcting the relative moving amount (X) and the relative moving amount (Y), which are supplied from the first and second calculation sections 42X and 42Y respectively, by predetermined offsets. Further, as an example, the third calculation section 42T outputs, as the relative moving amount of the second member 7 relative to the first member 6 in the Z direction, a value obtained by correcting an average value (=(ZX+ZY)/2) of the relative moving amount (ZX) and the relative moving amount (ZY) in the Z direction, which are supplied from the first and second calculation sections 42X and 42Y respectively, by a predetermined offset. The detection resolving powers of the relative moving amounts in the X, Y and Z directions are, for example, about 0.5 nm to about 0.1 nm. Since the optical paths of the measuring light ML, etc. are short in the encoder 10, it is possible to reduce the short-term change (variation) of the measured value due to the temperature fluctuation of the air on the optical path. Further, since the interference light generated by interference between the +1st order diffracted lights EX1 and EY1 which are double diffracted lights and the reference lights RX1 and RY1 corresponding to the +1st order diffracted lights EX1 and EY1 and the interference light generated by interference between the −1st order diffracted lights EX2 and EY2 which are double diffracted lights and the reference lights RX2 and RY2 corresponding to the −1st order diffracted lights EX2 and EY2 are finally detected, the detection resolving power (detection precision) of the relative movement amount can be improved (miniaturized) to ½. Furthermore, by using the ±1st order diffracted lights, it is possible to reduce any measurement error due to the relative rotational angle between the first member 6 and the second member 7 in the θz direction.

Next, the optical path of the diffracted light of the detection head 14 of the embodiment will be explained in detail.

In FIG. 2A, when the measuring light ML perpendicularly comes into the grating pattern 12a of the diffraction grating 12 (when the measuring light comes into the grating pattern 12a in parallel to the Z axis), a diffraction angle φx of the +1st order diffracted light DX1 in the X-direction brought about by the measuring light ML satisfies the following relationship using the period p of the grating pattern 12a and the wavelength λ of the measuring light ML. At this time, a diffraction angle of the −1st order diffracted light DX2 in the X-direction brought about by the measuring light ML is −φx.

$$p \cdot \sin(\phi x) = \lambda \quad (1)$$

As an example, provided that the period p is 1,000 nm (1 μm) and the wavelength λ of the measuring light ML is 633 nm, then the diffraction angle φX is approximately 39 degrees.

Further, the diffracted light DX1 is bent by the cuneiform prism 26A so that the optical path of the diffracted light DX1 is parallel to the measuring light ML (here, parallel to the Z axis), and the diffracted light DX1 comes into the corner cube 24A. Therefore, provided that a deflection angle of the cuneiform prism 26A with respect to the incident light is δ, it is preferable that the deflection angle δ is same as the diffraction angle φx as follows.

$$\delta = \phi x = \arcsin(\lambda/p) \quad (2)$$

In other words, a vertical angle (apical angle) α, a refractive index ng of the cuneiform prism 26A and an incident angle i of the diffracted light DX1 with respect to the cuneiform prism 26A (rotational angle θy of the cuneiform prism 26A) are preferably set so that the deflection angle δ is the diffraction angle φx. Further, in this embodiment, it is preferable that a rate of change (dδ/di) of the deflection angle δ with respect to the incident angle i is set to be cos(φx), as indicated below.

$$d\delta/di = \cos(\phi x) = \cos\{\arcsin(\lambda/p)\} \quad (3)$$

The condition which is defined by this formula (3) means that in the cuneiform prism 26A, the rate of change (dδ/di) of the deflection angle δ of the cuneiform prism 26A cancels out the rate of change in the diffraction angle of the diffracted light DX1 brought about when the incident angle of the measuring light ML with respect to the diffraction grating 12 is changed from 0 (zero) (to be described in detail later on).

In a case that the measuring light ML comes into the grating pattern 12a perpendicularly (in parallel to the Z axis), the diffracted light DX1 travelling from the cuneiform prism 26A toward the corner cube 24A is parallel to the Z axis; and the diffraction light DX1 reflected by the corner cube 24A comes into the grating pattern 12a perpendicularly at a position shifted in the +X direction from the position at which the measuring light ML came into the grating pattern 12a. Further, the diffraction angle of the +1st order diffracted light EX1 generated, via diffraction of the diffracted light DX 1, from the grating pattern 12a is same as "φx" of the formula (1); and the optical path of the +1st order diffraction light EX1 is bent by the cuneiform prism 26A to be parallel to the Z axis and travels toward the PBS 28A (via the mirror 23A). At this time, the −1st order diffracted light DX2 from the diffraction grating 12 brought about by the measuring light ML comes into the grating pattern 12a perpendicularly, via the cuneiform prism 26B and the corner cube 24B, at a position shifted in the −X direction from the position at which the measuring light ML came into the grating pattern 12a so that the −1st order diffracted light DX2 is symmetrical to the +1st order diffracted light DX1. Further, the optical path of the −1st order diffraction light EX2 generated, via diffraction of the diffracted light DX2, from the diffraction grating 12 is bent by the cuneiform prism 26B to be parallel to the Z axis and travels toward the PBS 28B (via the mirror 23B).

Figure 2B:
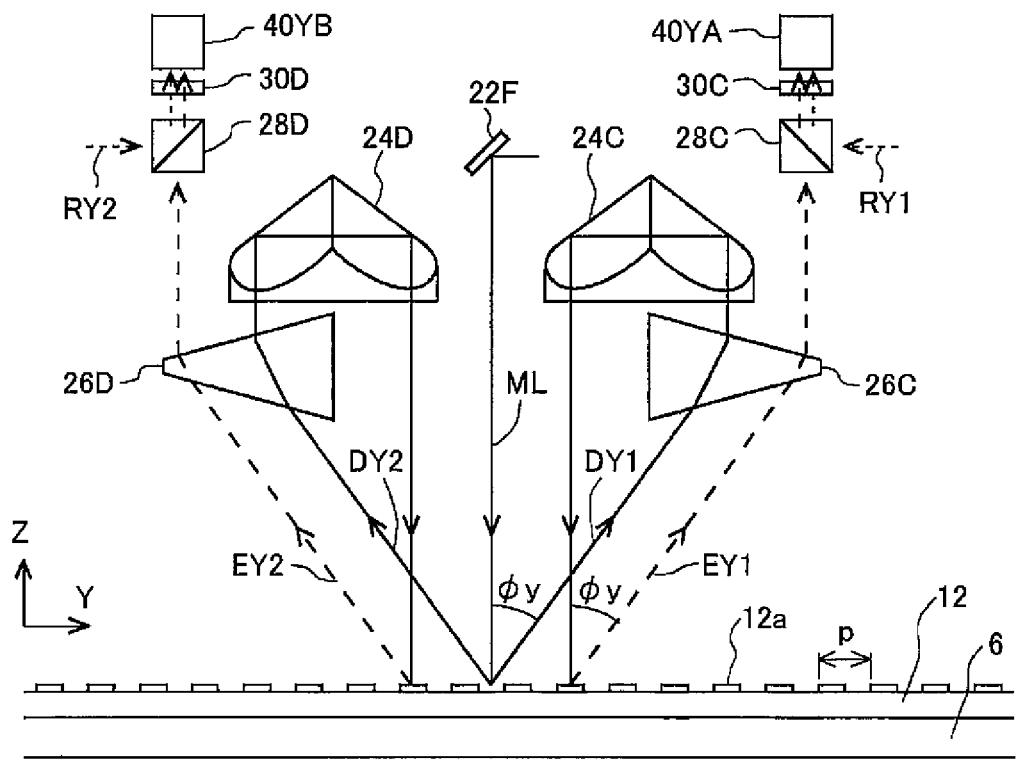

Furthermore, in FIG. 2B, when the measuring light ML comes perpendicularly into the grating pattern 12a of the diffraction grating 12, the diffraction angle φy of the +1st order diffracted light DY1 in the Y direction by the measuring light ML is same as the diffraction angle "φx" in the X direction of the formula (1). Moreover, the optical path of the +1st order diffraction light EY1 generated, via diffraction of the diffracted light DY1, from the diffraction grating 12 via the cuneiform prism 26C and the corner cube 24C and the optical path of the −1st order diffracted light EY2 in the Y direction generated, via diffraction of the diffracted light DY2, from the diffraction grating 12 via the cuneiform prism 26D and the corner cube 24D are bent by the cuneiform prisms 26C and 26D, respectively; and the ±1st order diffraction lights EY1 and EY2 travel toward the PBS 28C and the PBS 28D (via the mirrors 23C, 23D), respectively.

Figure 3A:
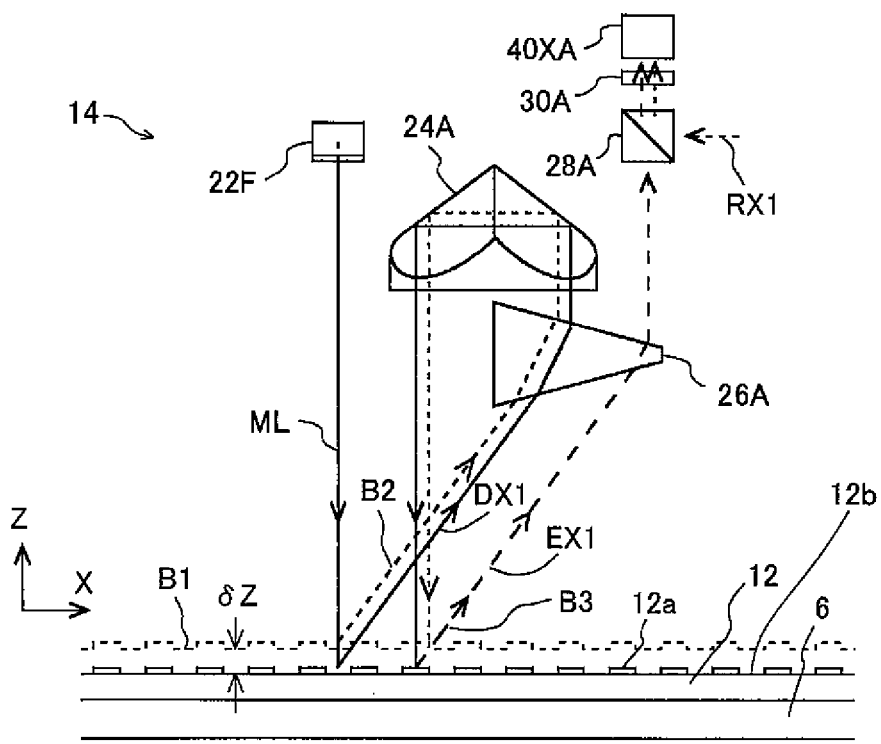
FIG. 3A is a diagram showing a change in the optical path of the diffracted light when the relative height of a grating pattern surface is changed and FIG. 3B is a diagram showing a change in the optical path of the diffracted light when the grating pattern surface is relatively inclined in the encoder shown in FIG. 1.

Further, the following case is assumed that in the arrangement shown in FIG. 2A, the relative position in the Z direction of the grating pattern surface 12b of the diffraction grating 12 is changed relative to the detection head 14 by δZ to a position B1, as shown in FIG. 3A with broken lines. In this case, the +1st order diffracted light DX1 brought about by the measuring light ML comes into the corner cube 24A in a state that the optical path of the +1st order diffraction light DX1 is parallely shifted to a position B2; however, in the corner cube 24A, the optical path of the exiting light is shifted, about the center in the X direction of the corner cube 24A, symmetrically to the incoming light. Thus, the diffracted light DX1 reflected by the corner cube 24A comes into the diffraction grating 12 at a position at which the grating pattern surface 12b, of which position has been changed to the position B1, crosses the optical path of the +1st order diffracted light EX1 which is provided under the condition that the relative position in the Z direction of the grating pattern surface 12b is not changed. Accordingly, even when the grating pattern surface 12b is changed or shifted to the position B1, an optical path B3 of the +1st order diffracted light EX1 generated, via diffraction of the diffracted light DX1, from the diffraction grating 12 is same as the optical path when the relative position in the Z direction of the grating pattern surface 12b is not changed. Therefore, when the diffracted light EX1 and the reference light RX1 are coaxially combined in the PBS 28A to generate the interference light, there is not any relative lateral shift amount between the diffracted light EX1 and the reference light RX1; and thus there is no lowering of the ratio of alternating current signal (beat signal or signal component) of the detection signal SA which is obtained when the interference light is photo-electrically converted.

This is same also with the −1st order diffracted light DX2 in the X axis and ±1st order diffracted lights DY1 and DY2 in the Y axis; even when the relative position of the grating pattern surface 12b in the Z direction is changed, the ratio of the beat signals of the detection signals SB to SD shown in FIG. 1 are not lowered. Accordingly, it is possible to measure the relative moving amount of the second member 7 relative to the first member 6 by using the detection signals SA to SD with a high S/N ratio and high precision.

Figure 3B:
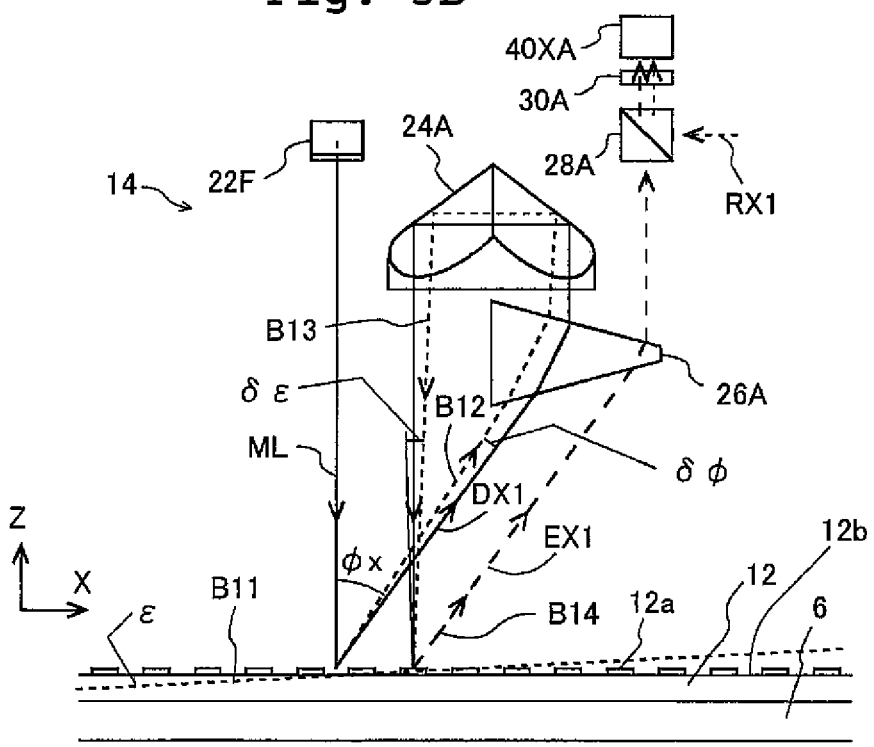

Next, the following case is assumed that in the arrangement shown in FIG. 2A, the grating pattern surface 12*b* of the diffraction grating 12 is changed relative to the detection head 14 counterclockwise about an axis parallel to the Y axis by an angle ε, as shown in FIG. 3B with broken lines. In this case, provided that the incident angle of the measuring light ML with respect to the grating pattern surface 12*b* is ε, and that the diffraction angle of the +1st order diffracted light DX1 is (φx+δφx), the following relationship holds.

$$\sin(\phi x + \delta\phi x) - \sin \varepsilon = \lambda/p \quad (4)$$

In this case, when ε and δφx are minute amounts, sin(φx) differentiated is cos(φx), and thus the formula (4) is as follows.

$$\sin(\phi x) + \cos(\phi x) \cdot \delta\phi x - \varepsilon = \lambda/p \quad (5)$$

In the formula (5), considering that "sin(φx)" is "λ/p" from the formula (1), the following formula is obtained.

$$\delta\phi x = \varepsilon \cos(\phi x) \quad (6)$$

Further, an amount of change δφ of the angle of an optical path B12, of the +1st order diffracted light DX1 from the diffraction grating 12 when the grating pattern surface 12*b* is inclined by the angle ε, is as follows.

$$\delta\phi = \{1 + 1/\cos(\phi x)\}\varepsilon \quad (7)$$

Furthermore, since the rate of change (dδ/di) of the deflection angle δ with respect to the incident angle i in the cuneiform prism 26A is cos(φx) as indicated in the formula (3), an amount of change δε1 of the angle of an optical path B13 of the diffracted light DX1 transmitted through the cuneiform prism 26A is as follows:

$$\delta\varepsilon 1 = \delta\phi \cdot \cos(\phi x) = \{\cos(\phi x) + 1\}\varepsilon \quad (8)$$

Moreover, since the grating pattern surface 12*b* is inclined by the angle ε, an incident angle δε of the diffracted light DX1 coming into the grating pattern surface 12*b* from the corner cube 24A is as follows.

$$\delta\varepsilon = \varepsilon \cdot \cos(\phi x) \quad (9)$$

When the diffracted light DX1 comes into the diffraction grating 12 again with the incident angle δε, an amount of change δφ1 of the diffraction angle of the +1st order diffracted light EX1 (double diffracted light) from the diffraction grating 12 brought about by the diffracted light DX1 is as follows from the formula (6).

$$\delta\phi 1 = \varepsilon \quad (10)$$

This means that the amount of change δφ1 of the diffraction angle of the diffracted light EX1 is same as the inclination angle ε of the grating pattern surface 12*b*, namely that an optical path B14 of the diffracted light EX1 is parallel to the optical path before the grating pattern surface 12*b* is inclined. Further, any lateral shift of the optical path B14 of the diffracted light EX1 does not occur. Accordingly, when the diffracted light EX1 and the reference light RX1 are coaxially combined in the PBS 28A to generate the interference light, there are not any relative inclination shift amount and any relative lateral shift amount between the diffracted light EX1 and the reference light RX1; and thus there is no lowering of the ratio of alternating current signal (beat signal or signal component) of the detection signal SA which is obtained when the interference light is photoelectrically converted. This is same also with the −1st order diffracted light EX2 of the X axis.

Further, also in a case that the grating pattern surface 12*b* of the diffraction grating 12 is inclined about an axis parallel to the X axis, there are not generated any shift in the inclination angle of the optical path and any lateral shift of the optical path of each of the ±1st order diffracted lights EY1 and EY2 of the Y axis as well. Accordingly, the ratios of the beat signals of the detection signals SB to SD shown in FIG. 1 are not lowered. Thus, it is possible to measure the relative moving amount of the second member 7 relative to the first member 6 by using the detection signals SA to SD with a high S/N ratio and high precision. Note that in a case that the grating pattern surface 12*b* is inclined about an axis parallel to the X axis (or the Y axis), the detection signals SA and SB of the X axis (or the detection signals SC and SD of the Y axis) are not substantially affected.

In the foregoing explanation, it is assumed that the diffraction grating 12 side is inclined with respect to the detection head 14. However, also in a case that the incident angle of the measuring light ML with respect to the diffraction grating 12 is changed from 0 (zero) by a minute amount in the X direction and/or the Y direction, there is not any inclination and lateral shift of the optical path of each of the diffracted lights EX1, EX2, EY1 and EY2 as well. Thus, it is possible to measure the relative moving amount of the second member 7 relative to the first member 6 with a high S/N ratio and high precision.

The effects, etc. of the embodiment are as follows.

The encoder 10 of the embodiment is a three-axis encoder which measures the relative moving amount of the second member 7 moving relative to the first member 6 three-dimensionally in the X, Y and Z directions. Further, the encoder 10 is provided with the reflective-type diffraction grating 12 which is provided on the first member 6 and which has the two-dimensional grating pattern 12*a* of which periodic directions are the X and Y directions; the laser light source 16 which generates a laser light including the measuring light ML and the reference light RX1; and the mirror 22F (light-incident optical member) which causes the measuring light ML to come into the grating pattern surface 12*b* of the diffraction grating 12 substantially perpendicularly. Further, the encoder 10 is provided with the corner cube 24A (first reflecting member) which is provided on the second member 7 and which reflects the +1st order diffracted light DX1 (first diffracted light) generated, via diffraction of the measuring light ML, from the diffraction grating 12 in relation to the X direction at the diffraction angle φx; the cuneiform prism 26A (first direction-changing member) arranged between the diffraction grating 12 and the corner cube 24A and changing the direction of the diffracted light DX1 so that the incident angle at which the diffracted light DX1 comes into the diffraction grating 12 is substantially 0 (zero) which is considerably smaller than the diffraction angle φx of the diffracted light DX1 (so that the diffracted light DX1 comes into the diffraction grating 12 substantially perpendicularly); the photoelectric sensor 40XA (first photodetector) which detects an interference light generated by interference between the reference light RX1 and the +1st order diffracted light EX1 (double diffracted light) generated, via diffraction of the diffracted light DX1, from the diffraction grating 12; and the measurement calculation section 42 (measuring section) which measures the relative moving amount of the second member 7 relative to the first member 6 by using a detection signal from the photoelectric sensor 40XA.

According to this embodiment, the incident angle of the diffracted light DX1 when coming into the diffraction grating 12 is made to be substantially 0 (zero) by the cuneiform prism 26A. Therefore, even when the relative position between the first member 6 and the second member 7 is changed and consequently the relative height (position in the Z direction) of the grating pattern surface 12b of the diffraction grating 12 relative to the corner cube 24A (detection head 14) is changed, there is not any substantial variation or fluctuation in the optical path of the diffracted light EX1 (double diffracted light) from the diffraction grating 12 brought about by the diffracted light DX1, and the relative shift amount in the lateral direction between the diffracted light EX1 and the reference light RX1 is substantially 0 (zero).

Accordingly, there is no lowering of the intensity of the beat signal (signal including the positional information) of the interference light with respect to the change in the height of the grating pattern surface 12b of the diffraction grating 12, thereby making it possible to maintain high measurement precision or accuracy of the relative moving amount of the second member 7 relative to the first member 6. On the other hand, if the relative positions in the X and Y directions between the first member 6 and the second member 7 are fixed, it is possible to presume the relative moving amount in the Z direction of the second member 7 relative to the first member 6 from the detection signal of the photoelectric sensor 40XA.

Furthermore, the encoder 10 is provided with the corner cube 24B (second reflecting member) which reflects the −1st order diffracted light DX2 (second diffracted light) of which order is different from the +1st order and which is generated, via diffraction of the measuring light ML, from the diffraction grating 12 in relation to the X direction; the cuneiform prism 26B (second direction-changing member) arranged between the diffraction grating 12 and the corner cube 24B and changing the direction of the diffracted light DX2 so that the incident angle at which the diffracted light DX2 comes into the diffraction grating 12 is substantially 0 (zero); the photoelectric sensor 40XB (second photo-detector) which detects an interference light generated by interference between the reference light RX2 and the −1st order diffracted light EX2 (double diffracted light) generated, via diffraction of the diffracted light DX2, from the diffraction grating 12. Therefore, it is possible to measure the relative moving amount of the second member 7 in the X and Z directions relative to the first member 6 by using detection signals from the photoelectric sensors 40XA and 40XB.

Further, the encoder 10 is provided with the corner cubes 24C and 24D which reflect the ±1st order diffracted lights DY1 and DY2, respectively, generated, via diffraction of the measuring light ML, from the diffraction grating 12 in relation to the Y direction; the cuneiform prisms 26C and 26D arranged between the diffraction grating 12 and the corner cubes 24C and 24D, respectively, and changing the directions of the diffracted lights DY1 and DY2 respectively so that an incident angle at which each of the diffracted lights DY1 and DY2 comes into the diffraction grating 12 is substantially 0 (zero); and the photoelectric sensors 40YA and 40YB which detect interference lights generated by interference between the reference lights RY1 and RY2 and the ±1st order diffracted lights EY1 and EY2 generated, via diffraction of the diffracted lights DY1 and DY2, from the diffraction grating 12, respectively. Therefore, even when the relative height of the grating pattern surface 12b of the diffraction grating 12 is changed, it is possible to measure the relative moving amount in the Y direction of the second member 7 relative to the first member 6 based on detection signals from the photoelectric sensors 40YA and 40YB.

Note that the cuneiform prisms 26A to 26D may change the directions of the diffracted lights DX1, DX2, DY1 and DY2 so that the incident angles, at which the diffracted lights DX1, DX2, DY1 and DY2 corresponding to the cuneiform prisms 26A to 26D respectively come into the diffraction grating 12, are smaller than the diffraction angles φx and φy. In the above-described embodiment, the cuneiform prisms 26A to 26D change the travelling directions of the diffracted lights DX1, DX2, DY1 and DY2 respectively to be parallel to or substantially parallel to the travelling direction of the measuring light ML (Z axis direction); and the corner cubes 24A and 24B (24C and 24D) change the travelling directions of the diffracted lights DX1, DX2 (DY1, DY2) coming thereinto by 180 degrees and cause the diffracted light DX1, DX2 (DY1, DY2) to exit from positions shifted in the X direction (Y direction) from the incident positions of the diffracted light DX1 and DX2 (DY1 and DY2). Therefore, the travelling directions of the diffracted lights DX1, DX2, DY1 and DY2 exiting from the corner cubes 24A to 24D, respectively, are parallel to or substantially parallel to the travelling direction of the measuring light ML (parallel to or substantially parallel to the Z axis direction). Here, when the travelling directions of the diffracted lights DX1, DX2, DY1 and DY2 exiting from the corner cubes 24A to 24D, respectively, are completely parallel to the travelling direction of the measuring light ML (completely parallel to the Z axis direction) and even when any change in the Z direction and/or any inclination(s) in the θX, θY direction(s) of the diffraction grating 12 are/is occurred, it is possible to make any lateral shift of the optical paths of the diffracted lights EX1, EX2, EY1 and EY2 from those before any change in the Z direction and/or any inclination(s) in the θX, θY direction(s) of the diffraction grating 12 occurred, to be 0 (zero). However, in this case, even if the travelling directions of the diffracted lights DX1, DX2, DY1 and DY2 exiting from the corner cubes 24A to 24D, respectively, are not completely parallel to the travelling direction of the measuring light ML (are not completely parallel to the Z axis direction), it is possible to make the above-described lateral shift of the optical paths of the diffracted lights EX1, EX2, EY1 and EY2 to be small on the condition that the incident angles of the diffracted lights DX1, DX2, DY1 and DY2 coming into the diffraction grating 12 are smaller than the diffraction angles φx, φy of the ±1st order diffracted lights DX1, DX2, DY1 and DY2 generated by the measuring light ML coming into the diffraction grating 12. Accordingly, also in this case, the relative shift amounts in the lateral direction of the diffracted lights EX1, EX2, EY1 and EY2 relative to the reference lights RX1, RX2, RY1 and RY2 are lowered, respectively, with respect to the change in the relative height (position in the Z direction) of the grating pattern surface 12b. Thus, it is possible to suppress the lowering of the intensity of the beat signal of the interference light with respect to the change in the height of the grating pattern surface 12b of the diffraction grating 12, thereby making it possible to measure the relative moving amount of the second member 7 relative to the first member 6 with high precision.

Note that in a case of using the cuneiform prisms 26A to 26D, the lateral shift of the diffracted light is lowered, even when the grating pattern surface 12b of the diffraction grating 12 is relatively inclined. Accordingly, it is possible to measure the relative moving amount highly precisely. Note that in a case that there is not any substantial inclination of the grating pattern surface 12b of the diffraction grating 12, it is allowable to use an optical member having a reflecting surface such as planar mirror, instead of using the cuneiform prisms 26A to 26D (direction-changing member).

The following modifications may be made to the embodiment described above.

In the embodiment described above, pairs of the corner cubes 24A to 24D, pairs of the cuneiform prisms 26A to 26D and pairs of the photoelectric sensors 40XA, 40XB, 40YA and 40YB are provided, with one of the pairs being provided regarding the X axis and the other of the pairs being provided regarding the Y axis. However, in a case of measuring the relative moving amount between the first member 6 and the second member 7 in three degrees of freedom, it is possible to omit a corner cube among the corner cubes (for example, the corner cube 24D), one cuneiform prism corresponding to the corner cube (for example, the cuneiform prism 26D) and one photoelectric sensor corresponding to the corner cube (for example, the photoelectric sensor 40YB).

Although the two-dimensional diffraction grating 12 is used in the embodiment described above, it is allowable to use a one-dimensional diffraction grating which has the periodicity, for example, only in the X direction, instead of using the diffraction grating 12. In this case, it is allowable to omit the optical members (such as the corner cubes 24C and 24D, the cuneiform prisms 26C and 26D, etc.) for detecting the diffracted lights generated in the Y direction and the photoelectric sensors 40YA, 40YB, etc. from the detection head 14; in this case, it is possible to measure the relative moving amounts in the X and Z directions between the first member 6 and the second member 7 by using the detection signals of the photoelectric sensors 40XA and 40XB. Further, it is allowable to omit the optical members (such as the corner cube 24B, the cuneiform prisms 26B, etc.) for detecting the −1st order diffracted light generated in the X direction and the photoelectric sensor 40XB, etc. from the detection head 14; in this case, it is possible to measure the relative moving amounts in the X and Z directions between the first member 6 and the second member 7 by using only the detection signal of the photoelectric sensor 40XA.

In the embodiment, the interference lights generated by interference between the diffracted lights EX1, EX2, EY1 and EY2 and the reference lights RX1, RX2, RY1 and RY2, respectively, are detected. It is allowable, however, to detect for example an interference light generated by interference between a X-axis +1st order diffracted light EX1 of a measuring light having a first frequency and a X-axis −1st order diffracted light EX2 of a measuring light having a second frequency (the light used in the embodiment as the reference light), and to detect an interference light generated by interference between a Y-axis +1st order diffracted light EY1 of the measuring light having the first frequency and a Y-axis −1st order diffracted light EY2 of the measuring light having the second frequency. In this case, it is possible to measure the relative moving amounts between the first member 6 and the second member 7 in the X and Y directions, and to perform the measurement always with a high S/N ratio and high precision, since there is no lateral shift between the two diffracted lights even when the relative height of the grating pattern surface 12b of the diffraction grating 12 is changed or varied.

Further, in the embodiment, the diffracted light DX1, etc., generated from the diffraction grating 12 come into the corner cube 24A, etc., via the cuneiform prism 26A, etc., respectively, and the diffracted lights, reflected by the corner cube 24A, etc., come into the diffraction grating 12. However, as in a detection head 14A of a first modification shown in FIG. 4, it is allowable to arrange a cuneiform prism 26A1, etc. in an optical path of each of the diffracted lights reflected by the corner cube 24A, etc. Note that in FIG. 4, the constitutive parts or components, which are the same as or equivalent to those shown in FIG. 2A, are designated by the same reference numerals, and any detailed explanation of which will be omitted as appropriate.

Figure 4:
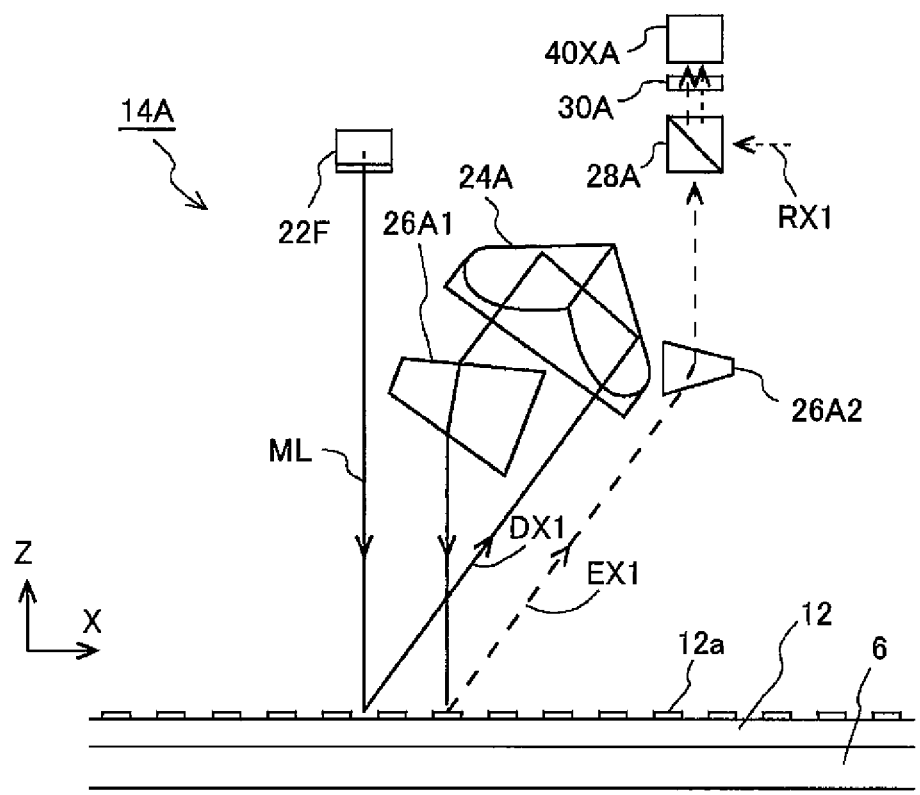
FIG. 4 is a diagram showing a part of an encoder according to a first modification.

In the detection head 14A of FIG. 4, the measuring light ML comes into the grating pattern 12a (grating pattern surface) of the diffraction grating 12 in substantially parallel to the Z axis; and the +1st order diffracted light DX1 in the X direction generated from the grating pattern 12a is reflected by the corner cube 24A, then is bent by a first cuneiform prism 26A1 so that the optical path of the +1st order diffracted light DX1 is substantially parallel to the Z axis, and comes into the grating pattern 12a. At this time, the corner cube 24A is supported so that the light-incident surface of the corner cube 24A is almost (approximately, substantially) perpendicular to the optical path of the diffracted light DX1 which comes into the light-incident surface. Further, the +1st order diffracted light EX1 (double diffracted light) in the X direction generated, via diffraction of the diffracted light DX1, from the diffraction grating 12 is bent by a second cuneiform prism 26A2 so that the optical path of the +1st order diffracted light EX1 is parallel to the Z axis, and then the +1st order diffracted light EX1 is combined with a reference light RX1 by a PBS 28A.

Regarding the remaining parts or components which detect the −1st order diffracted light of the X axis (the X direction) and the remaining parts or components which detect the ±1st order diffracted lights of the Y axis (the Y direction), cuneiform prisms which are similar to the cuneiform prism 26A1 are arranged in the optical paths of the diffracted lights reflected by the corner cubes 24B to 24D, respectively. Also by using the detection head 14A of this modification, similar effects to those of the embodiment described above can be obtained.

Further, in the embodiment, the cuneiform prism 26A, etc. are used to bend (change) the optical paths of the diffracted light DX1, etc. However, as in a detection head 14B of a second modification shown in FIG. 5A, it is allowable to use a one-dimensional blazed diffraction grating 32 which is a reflective diffraction grating having a period p with respect to the X direction (first direction), the period p being same as that of the reflective-type diffraction grating 12. Note that in FIGS. 5A and 5B, the constitutive parts or components, which correspond to those shown in FIG. 2A, are designated by the same reference numerals, and any detailed explanation of which will be omitted as appropriate.

In a detection head 14B of FIG. 5, it is assumed that the measuring light ML comes into the grating pattern 12a (grating pattern surface) of the diffraction grating 12 in parallel to the Z axis. At this time, the +1st order diffracted light DX1 in the X direction generated from the grating pattern 12a is reflected by the corner cube 24A, then is reflected by a mirror 22G which is parallel to the grating pattern surface, and comes into the one-dimensional diffraction grating 32. Since the period p in the X direction of the diffraction grating 32 is same as the period in the X direction of the diffraction grating 12 and the diffraction grating 32 is of the blazed type, substantially all of the light coming into the diffraction grating 32 (diffracted light DX1) is a +1st order diffracted light FX1 which is parallel to the Z axis. Namely, the diffraction grating 32 and the diffraction grating 12 have mutually reverse relationships in which the incident light and the diffracted light are switched; and the incident angle at which the measuring light ML comes into the diffraction grating 12 and the diffraction angle of the +1st order diffracted light FX1 generated from the diffraction grating 32 are same with each other, and the diffraction angle of the +1st order diffracted light DX1 in the X direction generated from the diffraction grating 12 and the incident angle at which the +1st order diffracted light DX1 comes into the diffraction grating 32 are same with each other.

At this time, the corner cube 24A is supported so that the incident surface of the corner cube 24A is substantially perpendicular to the optical path of the diffracted light DX1 which comes into the reflecting surface. Further, the +1st order diffracted light EX1 (double diffracted light) in the X direction generated, via diffraction of the diffracted light FX1, from the diffraction grating 12 is bent by a cuneiform prism 26A2 so that the optical path of the +1st order diffracted light EX1 is parallel to the Z axis, and then the +1st order diffracted light EX1 is combined with a reference light RX1 by a PBS 28A. Regarding the remaining parts or components which detect the −1st order diffracted light of the X axis (the X direction) and the remaining parts or components which detect the ±1st order diffracted lights of the Y axis (the Y direction), mirrors and one-dimensional diffraction gratings which are similar to the mirror 22G and the diffraction grating 32 are arranged in the optical paths of the diffracted lights reflected by the corner cubes 24B to 24D, respectively. Also by using the detection head 14B of the modification, similar effects to those of the embodiment described above can be obtained.

Figure 5A:
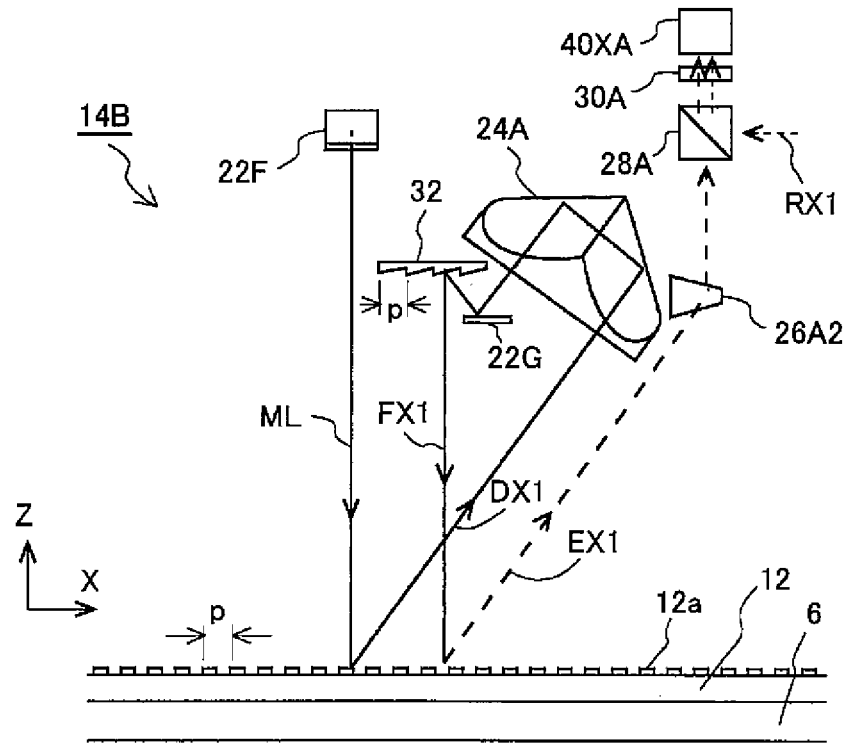
FIG. 5A is a diagram showing a part of an encoder according to a second modification.
Figure 5B:
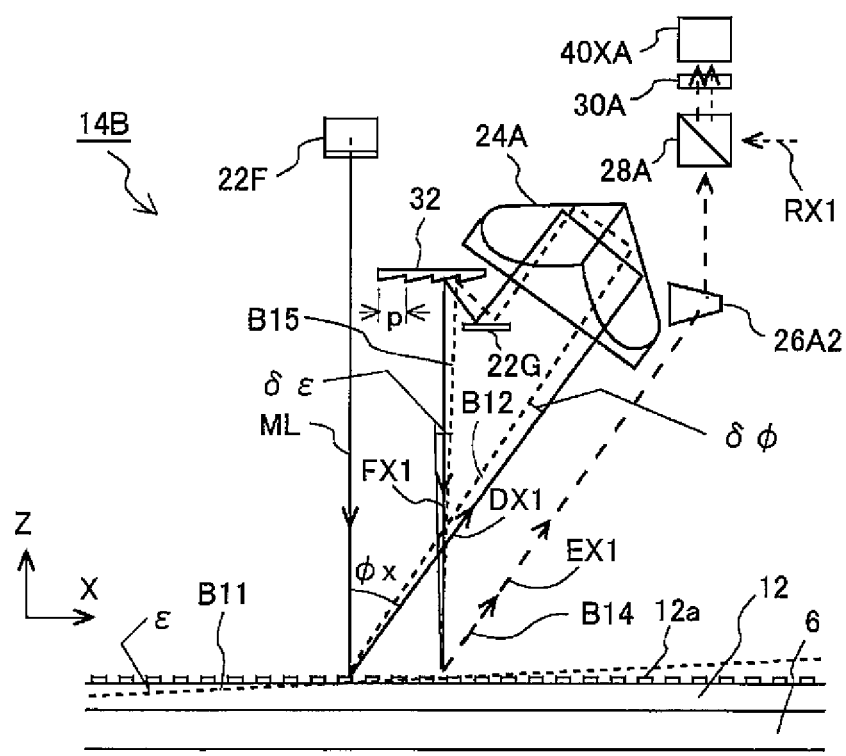
FIG. 5B is a diagram showing a change in the optical path of the diffracted light when the grating pattern surface is relatively inclined in the second modification.

Here, the following case is assumed that in the arrangement of the second modification shown in FIG. 5A, the grating pattern 12a (grating pattern surface) of the diffraction grating 12 is changed relative to the detection head 14B counterclockwise about an axis parallel to the Y axis by an angle ε, as shown in FIG. 5B with broken lines. At this time, provided that the incident angle of the measuring light ML with respect to the grating pattern 12a is ε, and that the diffraction angle of the +1st order diffracted light DX1 is ($\phi x+\delta \phi x$), the amount of change δϕx of the diffraction angle is as expressed in the formula (6) described above.

Further, an amount of change δϕ of the angle of an optical path B12, of the +1st order diffracted light DX1 from the diffraction grating 12, when the grating pattern 12a is inclined by the angle ε is as expressed in the formula (7) as described above.

Furthermore, in the diffraction grating 32, the relationship opposite (reverse) to that of the formula (6) described above holds. Accordingly, the rate of change in the diffraction angle of the +1st order diffracted light FX1 in the diffraction grating 32 with respect to the incident angle of the incident light (diffracted light DX1) is $\cos(\phi x)$. This is same as the rate of change in the cuneiform prism 26A of the embodiment (FIG. 2A). As a result, an amount of change 661 of the angle of an optical path 15B of the diffracted light FX1 generated from the diffraction grating 32 is $\delta \varepsilon 1 = \{\cos(\phi x) + 1\}\varepsilon$ that is same as the formula (8) described above.

Furthermore, since the grating pattern 12a (grating pattern surface) is inclined by the angle ε, an incident angle δε of the diffracted light FX1 coming into the grating pattern 12a from the diffraction grating 32 is $\delta \varepsilon = \varepsilon \cdot \cos(\phi x)$ that is same as the formula (9) described above.

Moreover, when the diffracted light FX1 comes into the diffraction grating 12 with the incident angle δε, an amount of change 60 of the diffraction angle of the +1st order diffracted light EX1 (double diffracted light) from the diffraction grating 12 brought about by the diffracted light FX1 is same as the inclination angle ε (see the formula (10) described above), from the formula (6).

This means that the amount of change δϕ1 of the diffraction angle of the diffracted light EX 1 is same as the inclination angle ε of the grating pattern 12a, namely that an optical path B14 of the diffracted light EX1 is parallel to the optical path before the grating pattern 12a is inclined. Further, any lateral shift of the optical path B14 of the diffracted light EX1 does not occur.

Accordingly, when the diffracted light EX1 and the reference light RX1 are coaxially combined in the PBS 28A to generate the interference light, there are not any relative inclination shift amount and any relative lateral shift amount between the diffracted light EX1 and the reference light RX1; and thus there is no lowering of the ratio of alternating current signal (beat signal or signal component) of the detection signal SA which is obtained when the interference light is photo-electrically converted.

Note that in the second modification shown in FIG. 5A, the diffraction grating 32 and the mirror 22G may be arranged in a portion, of the optical path of the diffracted light DX1, via which the diffracted light DX1 travels from the diffraction grating 12 toward the corner cube 24A.

Note that in the above-described modification, the diffraction grating 32, which can be considered as the first direction-changing member, has the period with respect to the X direction (first direction) that is same as the period p of the reflective-type diffraction grating 12. It is allowable, however, to shift the period of the diffraction grating 32 a little or to some extent from the period p of the reflective-type diffraction grating 12. Alternatively, it is allowable to slightly incline the period of the one-dimensional diffraction grating 32 with respect to the X and Y directions (first and second directions) that are the periodic directions of the reflective-type diffraction grating 12. Still alternatively, it is allowable to shift the three reflecting surfaces of the corner cube 24A, which can be considered as the first reflecting member, so that the angles defined by the three reflecting surfaces are not orthogonal to one another. Further alternatively, it is allowable to set the deflection angle by first direction-changing member so that the travelling direction of the measuring light ML coming into the grating pattern surface 12b of the diffraction grating 12 and the travelling direction of the diffracted light diffracted by the grating pattern surface 12b and then coming into the grating pattern surface 12b again via the corner cube 24A are changed from being parallel to each other to being shifted slightly from each other.

Note that in the configuration shown in FIG. 1, the optical path length of the reference light RL (RX1, RX2, RY1, RY2) from the light source (for example, the laser light source 16) up to the interference section (for example, PBSes 28A to 28D) may be set to be substantially same as the optical path length of the measuring light ML (diffracted lights EX1, EX2, EY1, EY2). In this case, it is possible to provide a configuration in which the optical path length of the reference light RL is made to be substantially same as the optical path length of the measuring light ML, with the arrangement of the optical elements inside the detection head 14 of the encoder 10. Alternatively, it is also possible to provide a configuration in which the optical path length of the reference light RL is made to be substantially same as the optical path length of the measuring light ML ranging from the light source and arriving at the detection head 14 (for example, in a case that a light guiding section such as an optical fiber, etc. is used, this configuration can be provided by adjusting the length of the light guiding section, etc.).

Note that in the configuration shown in FIG. 1, it is allowable to use diffraction gratings (typically, one-dimensional diffraction gratings) having deflection function that is equivalent to the deflection function of the cuneiform prisms 26A to 26D, instead of using the cuneiform prisms 26A and 26B.

In a case of using such diffraction gratings, it is allowable to shift the period of the grating pattern of each of the diffraction gratings slightly or to some extent from the period of the reflective-type diffraction grating 12. Alternatively, it is allowable to slightly incline the periodic direction of these diffraction gratings with respect to the X and Y directions (first and second directions) that are the periodic directions of the reflective-type diffraction grating 12. Still alternatively, it is allowable also in this case to shift the three reflecting surfaces of the corner cube 24A, which can be considered as the first reflecting member, so that the angles defined by the three reflecting surfaces are not orthogonal to one another. Further alternatively, it is allowable also in this case to set the deflection angle (diffraction angle) by the one-dimensional diffraction grating so that the travelling direction of the measuring light ML coming into the grating pattern surface 12b of the diffraction grating 12 and the travelling direction of the diffracted light diffracted by the grating pattern surface 12b and then coming into the grating pattern surface 12b again via the corner cube 24A are changed from being parallel to each other to being shifted slightly from each other.

Further, in the configurations shown in FIGS. 1 to 4, although the corner cubes 24A to 24D and the cuneiform prisms 26A to 26D are formed as separate members or bodies, respectively, it is allowable to form the corner cubes 24A to 24D and the cuneiform prisms 26A to 26D as integrated bodies, respectively. For example, it is allowable to form the corner cube 24A and the cuneiform prism 26A as an integrated body without providing any spacing distance therebetween, and similarly to form the corner cubes 24B to 24D and the cuneiform prisms 26B to 26D corresponding thereto respectively as integrated bodies without providing any spacing distances therebetween, respectively. In such a case, the shape of each of the cuneiform prisms 26A to 26D are adjusted so that the diffracted lights DX1, DX2, DY1 and DY2, of which travelling directions are changed by the corner cubes 24A to 24D and the cuneiform prisms 26A to 26D formed as integrated bodies, respectively, come into the diffraction grating 12 substantially perpendicularly.

Second Embodiment

Figure 6:
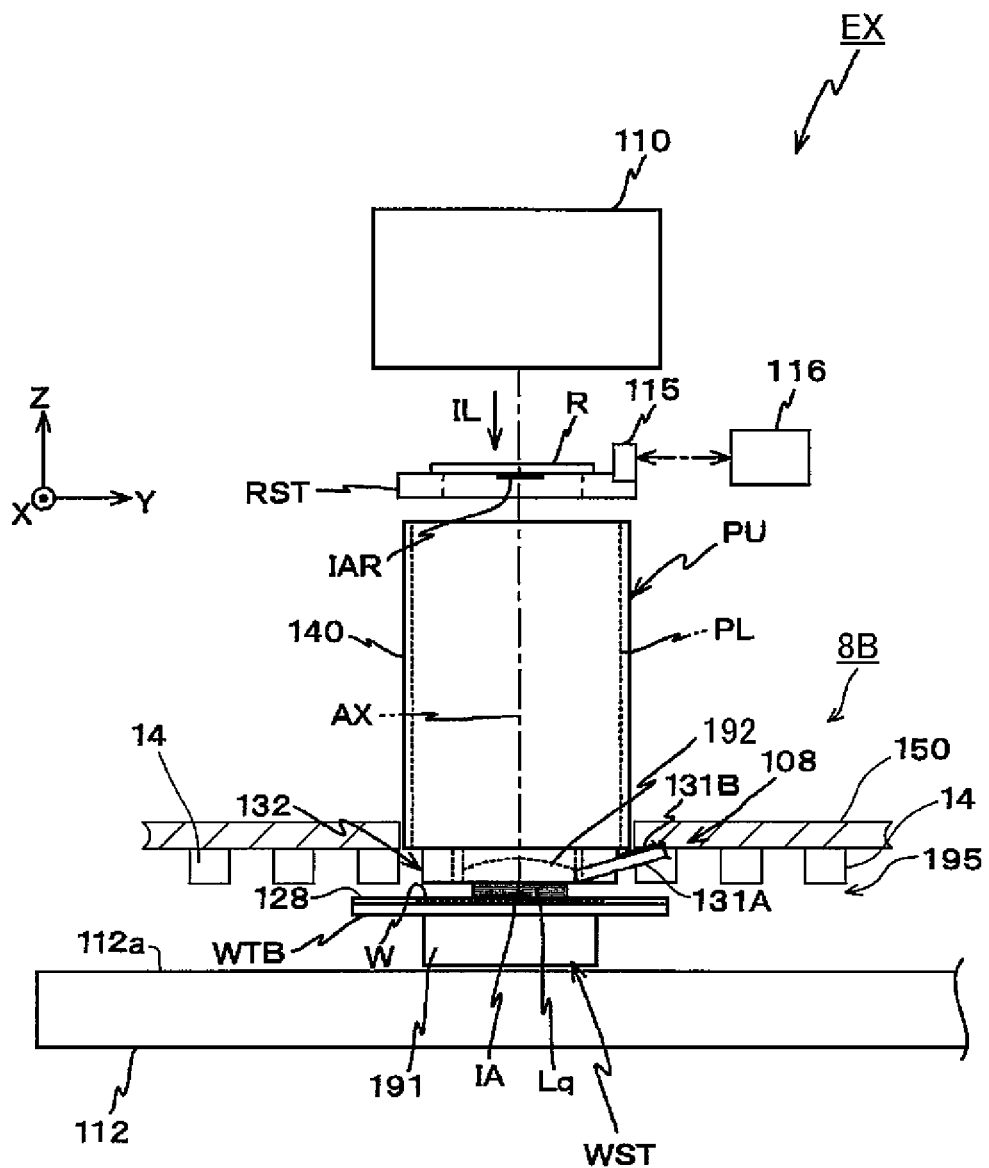
FIG. 6 is a schematic view showing the construction of an exposure apparatus according to a second embodiment of the present teaching.

A second embodiment of the present teaching will be explained with reference to FIGS. 6 to 8. FIG. 6 is a schematic view showing the construction of an exposure apparatus EX provided with an encoder device according to the second embodiment of the present teaching. The exposure apparatus EX is a projection exposure apparatus of the scanning exposure type constructed of a scanning stepper. The exposure apparatus EX is provided with a projection optical system PL (projection unit PU). In the following explanation, as shown in FIG. 6, it is assumed that the Z axis is the axis extending in the direction parallel to an optical axis AX of the projection optical system PL, the Y axis is the axis extending in the direction in which a reticle R and a wafer W are subjected to the relative scanning in a plane (substantially a horizontal plane) orthogonal to the Z axis, and the X axis is the axis extending in a direction orthogonal to the Z axis and the Y axis.

With reference to FIG. 6, the exposure apparatus EX is provided with an illumination system 110 disclosed, for example, in United States Patent Application Publication No. 2003/0025890; a reticle stage RST which holds a reticle R (mask) illuminated with an illumination light (illumination light beam; exposure light) IL for the exposure (for example, an ArF excimer laser light beam having a wavelength of 193 nm, a high harmonic wave of a solid-state laser (a semiconductor laser, etc.)) from the illumination system 110. All of the contents of United States Patent Application Publication No. 2003/0025890 are incorporated herein by reference in their entireties. Further, the exposure apparatus EX is provided with the projection unit PU including the projection optical system PL which projects the illumination light IL exiting from the reticle R onto the wafer W (substrate); a stage device 195 including a wafer stage WST which holds the wafer W; a control system; etc. (see FIG. 8).

The reticle R is held to the upper surface of the reticle stage RST by means of the vacuum attraction, etc. A circuit pattern, etc., is formed on a pattern surface (lower surface) of the reticle R. The reticle stage RST is finely movable in the XY plane and is capable of being driven in the scanning direction (Y direction) at a designated scanning velocity by a reticle stage driving system 111 including for example a linear motor, etc., as shown in FIG. 8.

The position information (including the positions in the X and Y direction and the rotational angle in the θz direction) of the reticle stage RST in the movement plane thereof is always detected at a resolution of, for example, about 0.5 nm to about 0.1 nm via a movement mirror 115 (or a mirror-finished side surface of the stage) by a reticle interferometer 116 including a laser interferometer. A measured value by the reticle interferometer 116 is sent to a main controller 120 constructed of a computer as shown in FIG. 8. The main controller 120 controls the reticle stage driving system 111 based on the measured value of the reticle interferometer 116 to thereby control the position and velocity of the reticle stage RST.

In FIG. 6, the projection unit PU arranged at a position below or under the reticle stage RST is provided with a barrel 140, and the projection optical system PL including a plurality of optical elements which are held in a predetermined positional relationship inside the barrel 140. The projection optical system PL is, for example, telecentric on the both sides and has a predetermined projection magnification β (for example, reduction magnification such as ¼, ⅕, etc.). When an illumination area IRA of the reticle R is illuminated with the illumination light IL from the illumination system 110, an image of the circuit pattern in the illumination area IAR of the reticle R is formed via the projection optical system PL in an exposure area IA (area conjugated with the illumination area IAR) in one shot area of the wafer W (semiconductor wafer) by the illumination light IL allowed to pass through the reticle R.

Further, the exposure apparatus EX is provided with a nozzle unit 132 which constructs a part or portion of a local liquid immersion device 108 so as to surround an lower end portion of the barrel 140 holding an end-portion lens 192 which is included in the plurality of optical elements constructing the projection optical system P1 and which is an optical element closest to the image plane side (closest to the wafer W side), for the purpose of performing the exposure to which the liquid immersion method is applied. The nozzle unit 132 is connected to a liquid supply device 186 and a liquid recovery device 189 (see FIG. 8) via a supply tube 131A for supplying an exposure liquid Lq (for example, pure water or purified water) and a recovery tube 131B for recovering the exposure liquid Lq, respectively. Note that when the exposure apparatus EX is an exposure apparatus which is not of the liquid immersion type, the local liquid immersion device 108 may be omitted.

The wafer stage WST is supported in a non-contact manner via, for example, a plurality of un-illustrated vacuum pre-loadable pneumatic static pressure bearings (air pads) on an upper surface 112a, of a base plate 112, which is parallel to the XY plane. The wafer stage WST can be driven in the X and Y directions by, for example, a stage driving system 124 (see FIG. 8) including a planer motor or two pairs of linear motors orthogonal to each other. Further, the exposure apparatus EX is provided with a spatial image-measuring system (not shown) which performs alignment of the reticle R; an alignment system AL (see FIG. 8) which performs alignment of the wafer W; a multipoint autofocus sensor 90 (see FIG. 8) of the oblique incidence system which includes a light-emitting system 90a and a light-receiving system 90b and which measures the positions in the Z direction of a plurality of points on a surface of the wafer W; and an encoder device 8B which measures positional information of the wafer stage WST.

The wafer stage WST is provided with a body 191 of the wafer stage (stage body 191) which is driven in the X and Y directions; a wafer table WTB arranged on the stage body 191; and a Z-leveling mechanism (not shown in the drawing) which is provided inside the stage body 191 and which finely drives the position in the Z direction, the tilt angles in the θx and θy directions of the wafer table WTB (wafer W) with respect to the stage body 191. A wafer holder (not shown in the drawing), which holds the wafer W for example by the vacuum attraction, etc. on a suction surface approximately parallel to the XY plane, is provided on the wafer table WTB at an upper and central portion of the wafer table WTB.

Further, a flat plate-shaped plate body 128, having a high flatness and a surface (or a protective member) of which is provided to be approximately flush with the surface of the wafer (wafer surface) placed on the wafer holder and which is subjected to the liquid-repellent treatment for the liquid Lq, is provided on the upper surface of the wafer table WTB. The outer shape (contour) of the plate body 128 is rectangular, and a circular-shaped opening is formed in the central portion of the plate body 128, the opening being greater to some extent than the wafer holder (a wafer-placement area).

Figure 7:
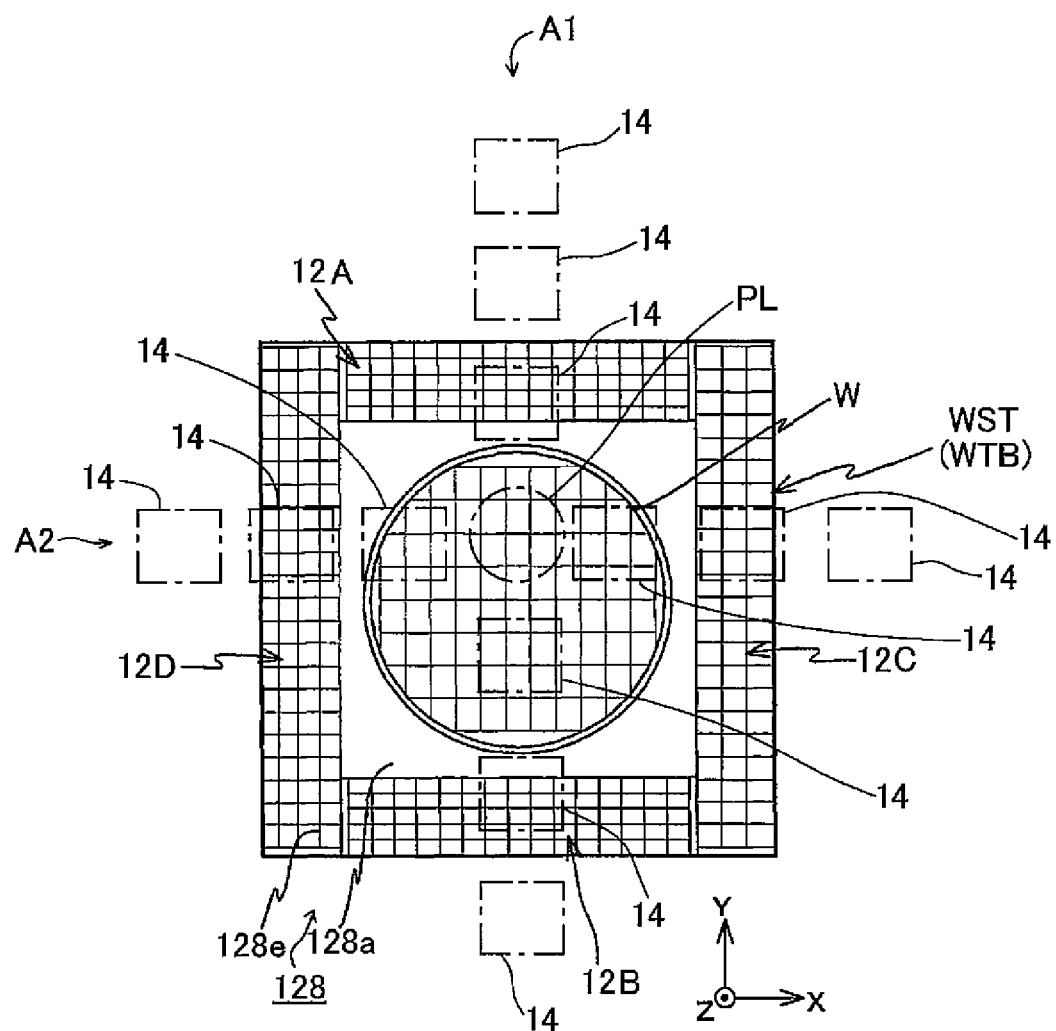
FIG. 7 is a plan view showing an example of the arrangement of a diffraction grating provided on a wafer stage shown in FIG. 6 and a plurality of detection heads.
Figure 8:
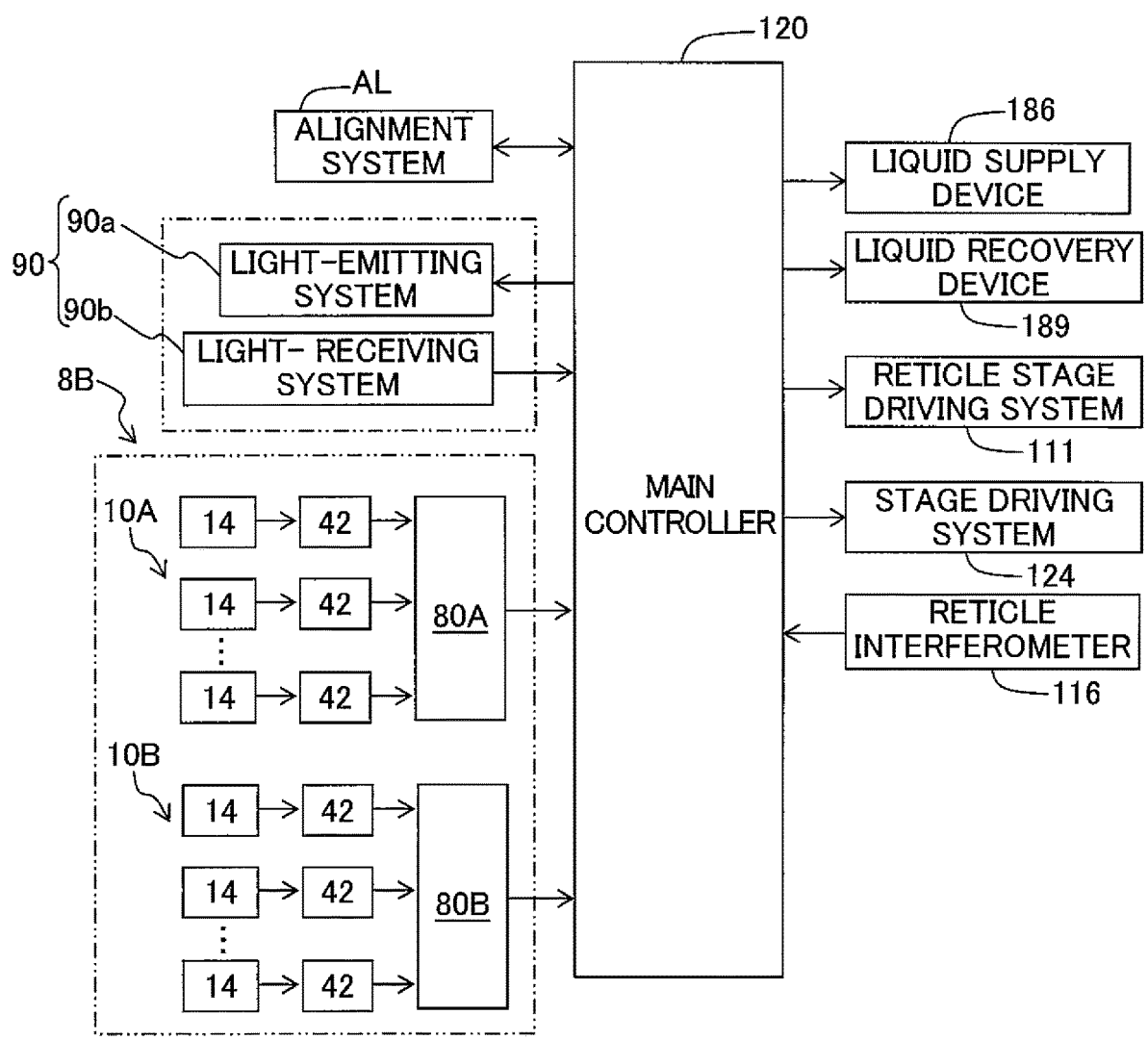
FIG. 8 is a block diagram showing a control system of the exposure apparatus shown in FIG. 6.

Note that in the exposure apparatus of the so-called liquid immersion type and provided with the local liquid immersion device 108 as described above, the plate body 128 further has a plate portion (liquid-repellent plate) 128a which has a rectangular outer shape (contour) surrounding the circular-shaped opening, and which has a surface subjected to the liquid-repellent treatment; and a periphery portion 128e surrounding the plate portion 128a, as shown in FIG. 7 that is a plan view of the wafer table WTB (wafer stage WST).

A pair of two-dimensional diffraction gratings 12A, 12B and a pair of two-dimensional diffraction gratings 12C, 12D are arranged on the upper surface of the periphery portion 128e. The pair of diffraction gratings 12A, 12B are elongated in the X direction so as to sandwich the plate portion 128a therebetween in the Y direction; and the pair of diffraction gratings 12C, 12D are elongated in the Y direction so as to sandwich the plate portion 128a therebetween in the X direction. Each of the diffraction gratings 12A to 12D is a reflective-type diffraction grating having a two-dimensional grating pattern of which periodic directions are the X and Y directions, similar to the diffraction grating 12 shown in FIG. 1.

Further, in FIG. 6, a measurement frame 150 which is flat plate-shaped and which is substantially parallel to the XY plane is supported, via a connection member (not shown in the drawing) by a frame (not shown in the drawing) supporting the projection unit PU. A plurality of detection heads 14 having the same construction as that of the three-axis detection head 14 shown in FIG. 1 is fixed to the bottom surface of the measurement frame 150 so that the plurality of detection heads 14 sandwich the projection optical system PL in the X direction; and a plurality of detection heads 14 having the same construction as that of the three-axis detection head 14 shown in FIG. 1 is fixed to the bottom surface of the measurement frame 150 so that the plurality of detection heads 14 sandwich the projection optical system PL in the Y direction (see FIG. 7). Further, there are also provided one laser source or a plurality of laser sources (not shown) similar to the laser light source 16 in FIG. 1 and for supplying a laser light or laser light beam (measuring light and reference light) to the plurality of detection heads 14.

In FIG. 7, during a period of time during which the wafer W is being exposed with the illumination light from the projection optical system PL, it is configured that any two of the plurality of detection heads 14 in a row A1 in the Y direction always face or are opposite to the diffraction gratings 12A and 12B and that any two of the detection heads 14 in a row A2 in the X direction always face or are opposite to the diffraction gratings 12C and 12D. Each of the detection heads 14 in the row A1 irradiates the measuring light to the diffraction grating 12A or 12B, and supplies the detection signal of the interference light, generated by interference between the diffracted light generating from the diffraction grating 12A or 12B and the reference light, to one of measurement calculation sections 42 (see FIG. 8) corresponding thereto. In a similar manner with the measurement calculation section 42 shown in FIG. 1, these measurement calculation sections 42 obtain the relative positions (relative movement amounts) in the X, Y and Z directions of the wafer stage WST relative to the measurement frame 150 at a resolution of, for example, 0.5 nm to 0.1 nm, and supply the respective measured values to a measured value-switching section 80A (see FIG. 8). The measured value-switching section 80A supplies, to the main controller 120, the information about the relative positions supplied from measurement calculation sections 42, among the measurement calculation sections 42, corresponding to the detection heads 14 facing the diffraction gratings 12A and 12B, respectively.

Further, each of the detection heads 14 corresponding to or aligned in the row A2 irradiates the measuring light to the diffraction head 12C or 12D, and supplies the detection signal of the interference light, generated by interference between the diffracted light generating from the diffraction grating 12C or 12D and the reference light, to one of measurement calculation sections 42 (see FIG. 8) corresponding thereto. In a similar manner with the measurement calculation section 42 shown in FIG. 1, these measurement calculation sections 42 obtain the relative positions (relative movement amounts) in the X, Y and Z directions of the wafer stage WST relative to the measurement frame 150 at a resolution of, for example, 0.5 nm to 0.1 nm, and supply the respective measured values to a measured value-switching section 80B. The measured value-switching section 80B supplies, to the main controller 120, the information about the relative positions supplied from measurement calculation sections 42, among the measurement calculation sections 42, corresponding to the detection heads 14 facing the diffraction gratings 12C and 12D, respectively.

A three-axis encoder 10A is constructed of the plurality of detection heads 14 in the row A1, the laser light source (not shown), the measurement calculation sections 42 and the diffraction gratings 12A and 12B; and a three-axis encoder 10B is constructed of the plurality of detection heads 14 in the row A2, the laser light source (not shown), the measurement calculation sections 42 and the diffraction gratings 12C and 12D. Further, the encoder device 8B is constructed of the three-axis encoders 10A and 10B and the measured-value switching sections 80A and 80B. The main controller 120 obtains informations about the position in the X, Y and Z directions, the rotational angle in the θz direction, etc. of the wafer stage WST with respect to the measurement frame 150 (the projection optical system PL), based on the informations about the relative positions supplied from the encoder device 8B; and the main controller 120 drives the wafer stage WST via the stage driving system 124 based on these informations.

When performing exposure by the exposure apparatus EX, at first, the reticle R and the wafer W are aligned with respect to each other. After that, an image of the pattern of the reticle R is transferred onto one shot area on the surface of the wafer W by performing a scanning exposure operation wherein the irradiation of the illumination light IL onto the reticle R is started and an image of a portion or part of the pattern of the reticle R is projected onto the one shot area via the projection optical system PL, while the reticle stage RST and the wafer stage WST are synchronously moved in the Y direction (subjected to synchronous scanning) at a velocity ratio of the projection magnification β of the projection optical system PL. After that, the operation in which the wafer W is step-moved in the X direction and the Y direction via the wafer stage WST and the scanning exposure operation described above are repeated. By doing so, the pattern image of the reticle R is transferred onto all the shot areas of the wafer W in the step-and-scan manner and based on or using the liquid immersion method.

At this time, the optical path lengths of the measuring light and the diffracted light in each of the detection heads 14 in the encoder device 8B are shorter than those in the laser interferometer. Therefore, the influence caused due to the fluctuation of the air and affecting the measured values using the detection heads 14 is very small. Thus, since the encoder device 8B of the embodiment has in particular excellent measurement stability in such a short term that the air is fluctuated (excellent short-term stability), it is possible to transfer the image of the pattern of the reticle R onto the wafer W highly precisely. Further, each of the detection heads 14 is capable of detecting the signal including the information about the relative moving amount always with high S/N ratio, even when the position in the Z direction of one of the diffracted gratings 12A to 12D is changed. Therefore, the wafer stage WST can be driven always with a high precision.

Note that in this embodiment, the detection heads 14 are arranged on the side of the measurement frame 150, and the diffraction gratings 12A to 12D are arranged on the side of the wafer stage WST. As another configuration different from the above-described configuration, it is allowable to arrange the diffraction gratings 12A to 12D on the side of the measurement frame 150 and to arrange the detection heads 14 on the side of the wafer stage WST. Such a configuration is described, for example, in U.S. Pat. Nos. 8,115,906, 8,228,482, 8,237,916, etc. and United States Patent Application Publications No. US2009/284717, No. US2009/284723, No. US2009/284724, etc. Here, the teachings of U.S. Pat. Nos. 8,115,906, 8,228,482, 8,237,916 and United States Patent Application Publications No. US2009/284717, US2009/284723 and No. US2009/284724 are incorporated herein by reference in their entireties.

Further, in the embodiment, the explanation has been given about a case that a diffraction grating is arranged on a surface, of the wafer stage WST, which is parallel to the XY plane, specifically the upper surface of the wafer stage WST. However, there is no limitation to this, and it is also allowable to adopt such a configuration that the diffraction grating is proved on the lower surface of the wafer stage WST as described, for example, in United States Patent Application Publications No. US2010/073652 and No. US2010/082095. Here, the teachings of United States Patent Application Publications No. US2010/073652 and No. US2010/082095 are incorporated herein by reference in their entireties. Note that it is also allowable to provide the diffraction grating to a side surface of the wafer stage WST.

Furthermore, in the embodiment, it is also allowable that a measuring stage MST is provided, separately from the wafer stage WST as described, for example, in United States Patent Application Publication No. US 2007/127006. Further, it is also allowable to apply the encoder of the embodiment to a twin-wafer stage system which uses two wafer stages and which is capable of executing, in a substantially parallel manner, an exposure operation and a measuring operation (for example, detection of a mark by an alignment system) as described, for example, in U.S. Pat. Nos. 6,341,007 and 6,262,796. Here, the teaching of United States Patent Application Publication No. US2007/127006 is incorporated herein by reference in its entirety.

Figure 9:
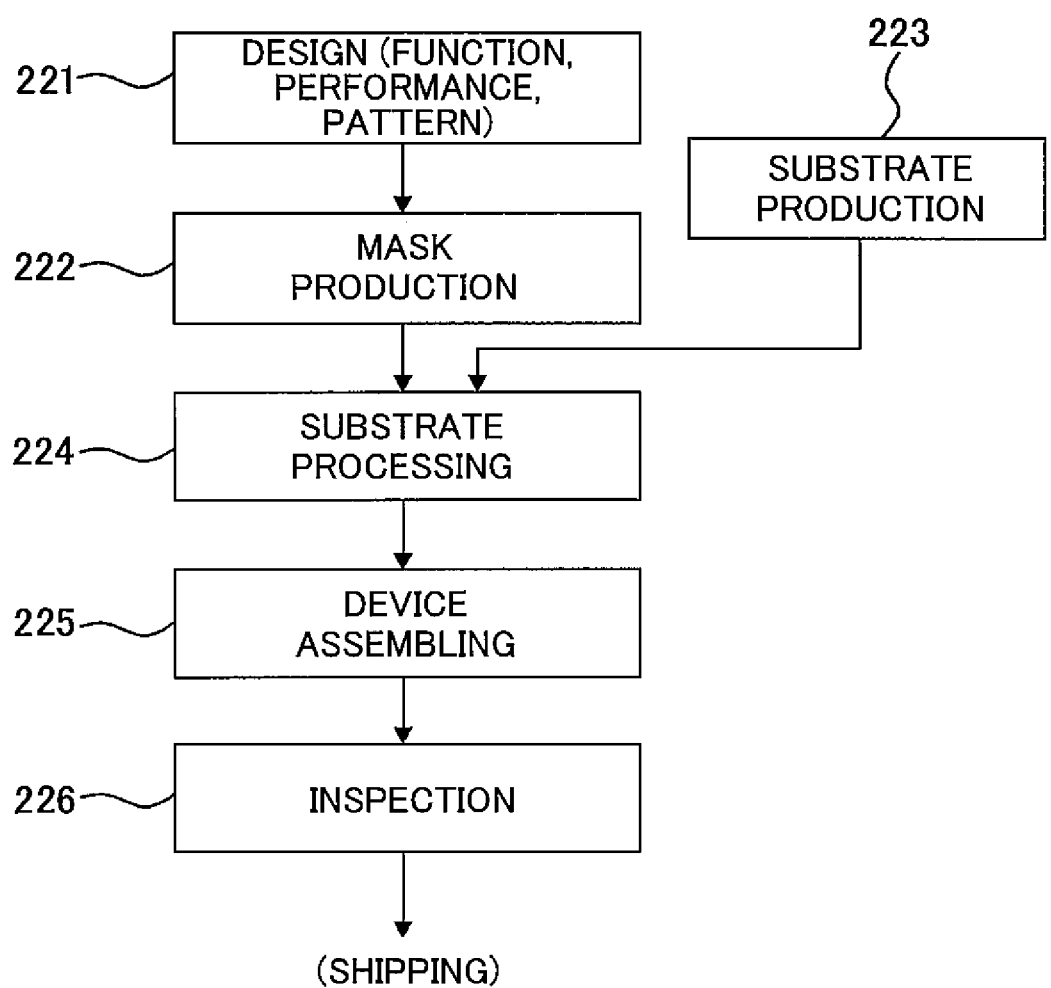
FIG. 9 is a flow chart showing an example of a method for producing an electronic device.

Further, in a case that an electronic device (or a micro device) such as semiconductor device, etc. is produced by using the exposure apparatus EX or the exposure method as referred to in the embodiment described above, the electronic device is produced, as shown in FIG. 9, by performing: a step 221 of designing the function and the performance of the electronic device; a step 222 of manufacturing a mask (reticle) based on the designing step; a step 223 of producing a substrate (wafer) as a base material for the device and of coating a resist on the substrate; a substrate-processing step 224 including a step of exposing the substrate (photosensitive substrate) with the pattern of the reticle by the above-described exposure apparatus (exposure method), a step of developing the exposed substrate, a step of heating (curing) and etching the developed substrate, and the like; a step 225 of assembling the device (including processing processes such as a dicing step, a bonding step, a packaging step, etc.); an inspection step 226; and the like.

In other words, the method for producing the device includes the lithography step of transferring the image of the pattern of the reticle onto the substrate (wafer) by using the exposure apparatus EX (exposure method) of the above-described embodiment and developing the exposed substrate; and the step of processing the substrate, onto which the image of the pattern has been transferred, based on the image of the pattern (the etching, etc. in the step 224). According to the embodiment, since the position of the wafer stage WST of the exposure apparatus EX can be controlled with a high precision, it is possible to produce the electronic device highly precisely.

As for the exposure apparatus EX, the present teaching is applicable not only to the scanning type-projection exposure apparatus (scanner), but also to a projection exposure apparatus (stepper, etc.) based on the step-and-repeat system. Further, the present teaching is also applicable similarly to an exposure apparatus of the dry type, other than the exposure apparatus of the liquid immersion type.

Further, the present teaching is not limited to the application to the exposure apparatus for producing semiconductor devices. The present teaching is also widely applicable, for example, to an exposure apparatus for producing a display apparatus including a liquid crystal display element formed on a square or rectangular glass plate, or a plasma display, etc., and an exposure apparatus for producing various devices including an image pickup element (CCD, etc.), a micromachine, a thin film magnetic head, and a DNA chip, etc. Further, the present teaching is also applicable to an exposure apparatus in which masks (photomasks, reticles, etc.), on which mask patterns for various devices are formed, are produced by using the photolithography step.

Moreover, the encoder 10 of the above-described embodiment is applicable to an optical apparatus including an optical system (optical system collecting a laser light, etc.) for an object-to-be-inspected or processed (inspection objective or processing objective), such as an inspection apparatus, a measuring apparatus, or the like and different from the exposure apparatus; and a moving device (stage, etc.) which moves the object-to-be-inspected or processed, so that the encoder 10 measures a relative moving amount of the moving device (object-to-be-inspected or processed) relative to, for example, the optical system. Further, the present teaching is also applicable to move the moving device (object, object-to-be-moved) based on a measurement result of the encoder.

According to the embodiments as described above, there is provided the first direction-change member which changes a direction of the first diffracted light so that the incident angle at which the first diffracted light comes into the diffraction grating is smaller than the diffraction angle of the first diffracted light. Therefore, even when the relative position between the first member and the second member (the relative position of the second member relative to the first member) is changed or varied and thus the relative height of the grating pattern surface of the diffraction grating relative to the first reflecting member is changed or varied, the change or variation in the optical path of the double diffracted light generated, via diffraction of the first diffracted light, from the diffraction grating is lowered, thereby lowering the relative shift amount of the double diffracted light relative to other light flux. Thus, it is possible to suppress the lowering of the signal intensity of the interference light with respect to the change in the height of the grating pattern surface of the diffraction grating, and to maintain a high measurement precision.

Note that it is a matter of course that the present teaching is not limited to the embodiments described above, and may be embodied in other various forms within a scope without deviating from the gist or essential characteristics of the present teaching.

Further, the present teaching can be described in accordance with the following items:

Item (1). An encoder device which measures a relative moving amount between a first member and a second member, the second member being supported to be movable relative to the first member at least in a first direction, the encoder device including:

a reflective-type diffraction grating provided on the first member and having a grating pattern of which periodic direction is at least the first direction;

a light source section which radiates a measuring light;

a light-incident optical member which is provided on the second member and which causes the measuring light to come into a grating pattern surface of the diffraction grating substantially perpendicularly;

a first reflecting member provided on the second member and causing a first diffracted light, which is generated, via diffraction of the measuring light, from the diffraction grating in relation to the first direction, to come into the diffraction grating;

a second reflecting member provided on the second member and causing a second diffracted light, of which order is different from that of the first diffracted light and which is generated, via diffraction of the measuring light, from the diffraction grating in relation to the first direction, to come into the diffraction grating;

a first photo-detector which detects an interference light generated by interference between a first double diffracted light and other light flux than the first double diffracted light, the first double diffracted light being generated, via diffraction of the first diffracted light, from the diffraction grating; and a second photo-detector which detects an interference light generated by interference between a second double diffracted light and other light flux than the second double diffracted light, the second double diffracted light being generated, via diffraction of the second diffracted light, from the diffraction grating; and a measuring section which obtains the relative moving amount between the first member and the second member by using detection signals from the first and second photo-detectors.

Item (2). The encoder device according to Item (1), wherein the second reflecting member is provided on the second member to be substantially symmetrical to the first reflecting member with respect to the light-incident optical member.

Item (3). The encoder device according to Item (1) or (2), further including a first direction-changing member arranged between the diffraction grating and the first reflecting member and making an incident angle at which the first diffracted light comes into the first reflecting member be small; and a second direction-changing member arranged between the diffraction grating and the second reflecting member and making an incident angle at which the second diffracted light comes into the second reflecting member be small.

Item (4). The encoder device according to any one of Items (1) to (3), wherein the diffraction grating is a two-dimensional, reflective-type diffraction grating of which periodic directions are the first direction and a second direction orthogonal to the first direction, wherein the encoder device further includes:

a third reflecting member provided on the second member and causing a third diffracted light, which is generated, via diffraction of the measuring light, from the diffraction grating in relation to the second direction, to come into the diffraction grating;

a fourth reflecting member provided on the second member and causing a fourth diffracted light, of which order is different from that of the third diffracted light and which is generated, via diffraction of the measuring light, from the diffraction grating in relation to the second direction, to come into the diffraction grating;

a third photo-detector which detects an interference light generated by interference between a third double diffracted light and other light flux than the third double diffracted light, the third double diffracted light being generated, via diffraction of the third diffracted light, from the diffraction grating; and a fourth photo-detector which detects an interference light generated by interference between a fourth double diffracted light and other light flux than the fourth double diffracted light, the fourth double diffracted light being generated, via diffraction of the fourth diffracted light, from the diffraction grating; and wherein the measuring section obtains the relative moving amount between the first member and the second member by using the detection signals from the first and second photo-detectors and detection signals from the third and fourth photo-detectors.

Item (5). The encoder device according to Item (4), wherein the measuring section obtains the relative moving amount between the first member and the second member in the first direction, the second direction, and a third direction which is perpendicular to the grating pattern surface of the diffraction grating.

Item (6). An exposure apparatus which exposes an object to be exposed with a pattern, the exposure apparatus including:

a frame;

a stage which supports the object and which is movable relative to the frame at least in a first direction; and the encoder device as defined in any one of Items (1) to (5) which measures a relative moving amount between the frame and the stage at least in the first direction.

What is claimed is:

1. An encoder device which measures a relative moving amount between a first member and a second member, a diffraction grating having a diffraction pattern of which periodic directions are a first direction and a second direction crossing the first direction being provided on the first member, the encoder device comprising:

a first optical member configured to direct a measuring light toward a surface of the diffraction grating along a first axis;

a second optical member which is provided on the second member and which is configured to deflect first, second, third and fourth diffracted lights generated, by the measuring light deflected from the diffraction grating, along second, third, fourth and fifth axes, respectively, back toward the diffraction grating, the first direction being a direction in a first plane including the second and third axes and the second direction being a direction in a second plane including the fourth and fifth axes;

a third optical member configured to deflect each of the first, second, third and fourth diffracted lights from the diffraction grating toward the second optical member multiple times in a direction toward the first axis; and first, second, third and fourth photo-detectors configured to receive fifth, sixth, seventh and eighth diffracted lights generated by the first, second, third and fourth diffracted lights deflected from the diffraction grating, respectively, wherein the third optical member is configured to deflect each of the fifth, sixth, seventh, and eighth diffracted lights multiple times.

2. The encoder device according to claim 1, wherein the second optical member comprises:

a first deflection member configured to deflect the first diffracted light from the third optical member so that the first diffracted light comes into the diffraction grating along a sixth axis;

a second deflection member configured to deflect the second diffracted light from the third optical member so that the second diffracted light comes into the diffraction grating along a seventh axis;

a third deflection member configured to deflect the third diffracted light from the third optical member so that the third diffracted light comes into the diffraction grating along a eighth axis; and a fourth deflection member configured to deflect the fourth diffracted light from the third optical member so that the fourth diffracted light comes into the diffraction grating along a ninth axis.

3. The encoder device according to claim 2, wherein the first deflection member is configured to deflect the first diffracted light from the third optical member so that the first diffracted light travels in the direction toward the first axis and then comes into the diffraction grating along the sixth axis;

the second deflection member is configured to deflect the second diffracted light from the third optical member so that the second diffracted light travels in the direction toward the first axis and then comes into the diffraction grating along the seventh axis;

the third deflection member is configured to deflect the third diffracted light from the third optical member so that the third diffracted light travels in the direction toward the first axis and then comes into the diffraction grating along the eighth axis; and the fourth deflection member is configured to deflect the fourth diffracted light from the third optical member so that the fourth diffracted light travels in a direction toward the first axis and then comes into the diffraction grating along the ninth axis.

4. The encoder device according to claim 3, wherein the sixth, seventh, eighth and ninth axes are parallel to the first axis.

5. The encoder device according to claim 4, wherein the first axis extends along a normal direction of the surface of the diffraction grating.

6. The encoder device according to claim 4, wherein an angle between the first axis and a normal of the surface of the diffraction grating is from 0.5 to 1.5 degrees.

7. The encoder device according to claim 2, wherein the sixth, seventh, eighth and ninth axes are parallel to the first axis.

8. The encoder device according to claim 7, wherein the first axis extends along a normal direction of the surface of the diffraction grating.

9. The encoder device according to claim 7, wherein an angle between the first axis and a normal of the surface of the diffraction grating is from 0.5 to 1.5 degrees.

10. The encoder device according to claim 1, further comprising a fourth optical member configured to divide the measuring light from the light source to generate first, second, third and fourth reference lights, and wherein the first photo-detector is configured to detect a first interference light generated by interference between the fifth diffracted light and the first reference light, the second photo-detector is configured to detect a second interference light generated by interference between the sixth diffracted light and the second reference light, the third photo-detector is configured to detect a third interference light generated by interference between the seventh diffracted light and the third reference light, and the fourth photo-detector is configured to detect a fourth interference light generated by interference between the eighth diffracted light and the fourth reference light.

11. The encoder device according to claim 10, further comprising a calculator configured to calculate the relative moving amount between the first member and the second member along the first and second directions by using outputs from the first, second, third and fourth photo-detectors.

12. The encoder device according to claim 11, wherein the calculator is configured to calculate the relative moving amount between the first member and the second member along a third direction crossing the first and second directions.

13. The encoder device according to claim 10, wherein the fourth optical member divides the measuring light traveling from the light source to the first optical member.

14. The encoder device according to claim 1, wherein the first direction and the second direction are orthogonal to each other.

15. A substrate support device which movably supports a substrate, the substrate support device comprising:
a stage configured to hold the substrate; and
the encoder device as defined in claim 1,
wherein the diffraction grating of the encoder device is provided on the stage.

16. An exposure apparatus which exposes a pattern onto an object-to-be-exposed, the exposure apparatus comprising:
a frame;
a stage which is configured to support the object-to-be-exposed and which is movable relative to the frame in first and second directions; and
the encoder device as defined in claim 1 configured to measure a relative moving amount of the stage in the first and second directions.

17. A device manufacturing method comprising a lithography step, wherein the lithography step includes exposing an object by using the exposure apparatus as defined in claim 16.

18. The encoder device according to claim 1, wherein the third optical member is configured to refract each of the first, second, third, and fourth diffracted lights toward the second optical member and each of the fifth, sixth, seventh, and eighth diffracted lights toward the first, second, third, and fourth photo-detectors, respectively, so that light from the diffraction grating is received by the third optical member along a first path and a second path different from the first path.

19. An encoder comprising:
a first member including a diffraction grating having a surface with a diffraction pattern provided in a grid pattern;
a first optical member configured to direct measuring light toward the surface of the diffraction grating;
four photo-detectors respectively configured to receive diffracted light and reference light; and
a second member configured to move relative to the first member and including four optical assemblies arranged around the measuring light directed from the first optical member,
wherein each optical assembly of the four optical assemblies is configured to
deflect multiple times, by a second optical member, the measuring light diffracted from the surface of the diffraction grating, as first diffracted light,
re-direct, by a third optical member separate from the second optical member, the first diffracted light from the optical assembly toward the surface of the diffraction grating,
deflect multiple times, by the second optical member, the re-directed first diffracted light diffracted from the surface of the diffraction grating, as second diffracted light,
to a respective photo-detector among the four photo-detectors.

20. The encoder according to claim 19, wherein each optical assembly of the four optical assemblies is configured to receive, by the second optical member, the first diffracted light along a first path and receive, by the second optical member, the second diffracted light along a second path different from the first path.

* * * * *